(12) United States Patent
Wolf

(10) Patent No.: US 11,181,826 B2
(45) Date of Patent: Nov. 23, 2021

(54) PROJECTION EXPOSURE METHOD AND PROJECTION EXPOSURE APPARATUS FOR MICROLITHOGRAPHY

(71) Applicant: Carl Zeiss SMT GmbH, Oberkochen (DE)

(72) Inventor: Alexander Wolf, Essingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/989,356

(22) Filed: Aug. 10, 2020

(65) Prior Publication Data

US 2020/0371444 A1   Nov. 26, 2020

Related U.S. Application Data

(63) Continuation of application No. 16/688,158, filed on Nov. 19, 2019, now Pat. No. 10,761,429, which is a (Continued)

(30) Foreign Application Priority Data

Jun. 2, 2017   (DE) .......................... 102017209440.0

(51) Int. Cl.
*G03B 27/52* (2006.01)
*G03F 7/20* (2006.01)

(52) U.S. Cl.
CPC .......... *G03F 7/70266* (2013.01); *G03F 7/702* (2013.01); *G03F 7/706* (2013.01)

(58) Field of Classification Search
CPC .. G02B 13/143; G02B 13/22; G02B 17/0852; G03F 7/702; G03F 7/70266; G03F 7/70308; G03F 7/706
See application file for complete search history.

(56) References Cited

U.S. PATENT DOCUMENTS 3,305,294 A    2/1967  Alvarez
10,761,429 B2 * 9/2020  Wolf ....................... G03F 7/706
(Continued)

FOREIGN PATENT DOCUMENTS

DE    10 2005 026 628 A1    12/2005
DE    10 2015 220 144 A1    4/2017
(Continued)

OTHER PUBLICATIONS

German Office Action, with translation thereof, for corresponding DE Appl No. 10 2017 209 440.0, dated Jan. 30, 2018.
(Continued)

*Primary Examiner* — Peter B Kim
(74) *Attorney, Agent, or Firm* — Fish & Richardson P.C.

(57) ABSTRACT

A projection exposure method and apparatus are disclosed for exposing a radiation-sensitive substrate with at least one image of a pattern of a mask under the control of an operating control system of a projection exposure apparatus, part of the pattern lying in an illumination region is imaged onto the image field on the substrate with the aid of a projection lens, wherein all rays of the projection radiation contributing to the image generation in the image field form a projection beam path.

22 Claims, 8 Drawing Sheets

Related U.S. Application Data continuation of application No. PCT/EP2018/063942, filed on May 28, 2018.

(56) References Cited

U.S. PATENT DOCUMENTS

| | | | |
|---|---|---|---|
| 2001/0033433 A1* | 10/2001 | Shinoda | G02B 19/0085 |
| | | | 359/798 |
| 2002/0067550 A1* | 6/2002 | Mizouchi | G03F 7/70058 |
| | | | 359/663 |
| 2006/0012799 A1 | 1/2006 | Wegmann | |
| 2007/0165202 A1 | 7/2007 | Koehler et al. | |
| 2009/0092925 A1 | 4/2009 | Omura | |
| 2010/0225889 A1 | 9/2010 | Sumiyoshi | |
| 2016/0252824 A1 | 9/2016 | Bittner et al. | |

FOREIGN PATENT DOCUMENTS

| | | |
|---|---|---|
| EP | 1 251 402 B1 | 10/2007 |
| WO | WO 2005/026843 A2 | 3/2005 |
| WO | WO 2006/121008 A1 | 11/2006 |
| WO | WO 2012/041459 A2 | 4/2012 |

OTHER PUBLICATIONS

International Search Report and Written Opinion, for corresponding Appl No. PCT/EP2018/063942, dated Oct. 19, 2018.

* cited by examiner

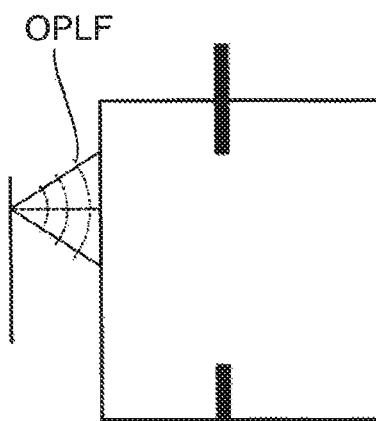
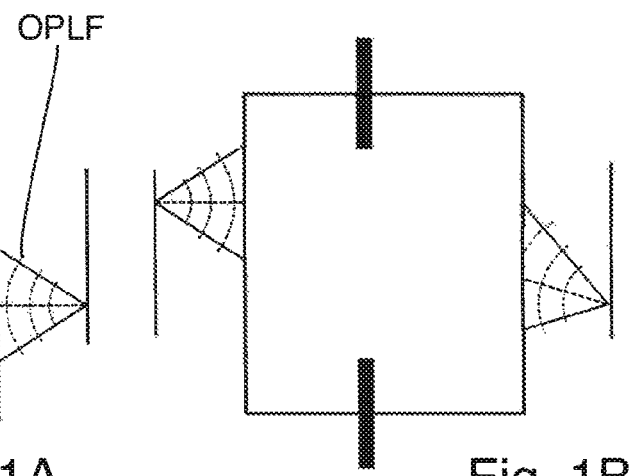
Fig. 1A  Fig. 1B
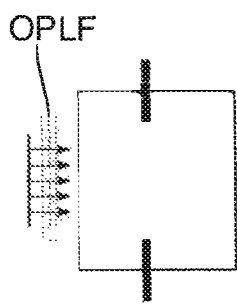
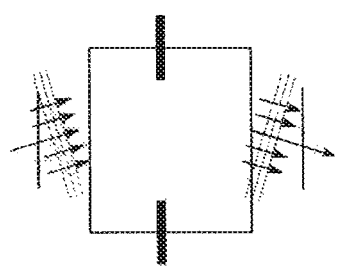
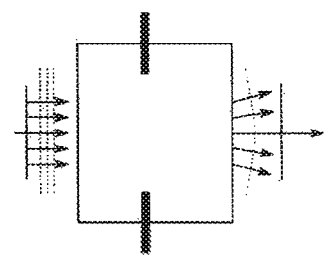
Fig. 2A  Fig. 2B  Fig. 2C
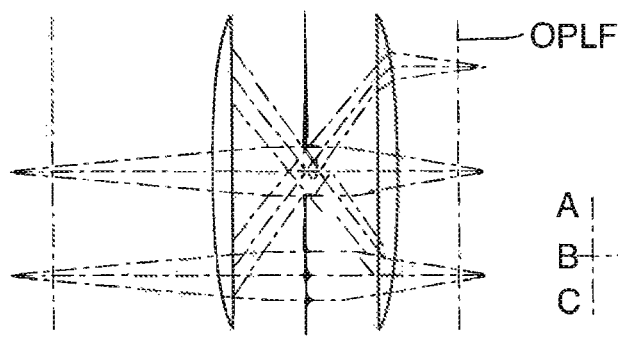
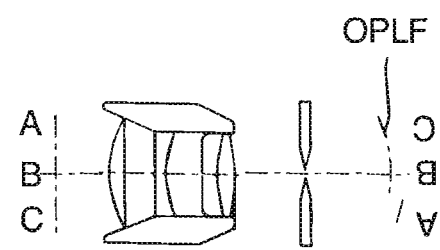
Fig. 3A  Fig. 3B

PROJECTION EXPOSURE METHOD AND PROJECTION EXPOSURE APPARATUS FOR MICROLITHOGRAPHY

CROSS-REFERENCE TO RELATED APPLICATIONS

This application is a continuation application of and claims benefit under 35 U.S.C. § 120 to U.S. application Ser. No. 16/688,158, filed Nov. 19, 2019, which is a continuation of International Application No. PCT/EP2018/063942, filed May 28, 2018, which claims benefit under 35 USC 119 to German Application No. 102017209440.0, filed Jun. 2, 2017. The entire disclosure of each of these applications are incorporated by reference herein.

FIELD

The disclosure relates to a projection exposure method, a projection exposure apparatus suitable for carrying out the projection exposure method, and a projection lens according.

BACKGROUND

These days, it is predominantly microlithographic projection exposure methods that are used for producing semiconductor components and other finely structured components, such as e.g. photolithography masks. Here, use is made of masks (reticules) or other pattern generating devices, which carry or form the pattern of a structure to be imaged, e.g. a line pattern of a layer of a semiconductor component. The pattern is positioned in the region of the object plane of the projection lens between an illumination system and a projection lens in a projection exposure apparatus and it is illuminated by illumination radiation provided by the illumination system. The radiation modified by the pattern travels through the projection lens as projection radiation, the projection lens imaging the pattern with a reduced scale onto the substrate to be exposed. The surface of the substrate is arranged in the image plane of the projection lens optically conjugate to the object plane. The substrate is generally coated with a radiation-sensitive layer (resist, photoresist).

One of the goals in the development of projection exposure apparatuses involves producing structures with increasingly smaller dimensions on the substrate by way of lithography. In the case of e.g. semiconductor components, smaller structures lead to higher integration densities; this generally has an expedient effect on the performance of the microstructured components produced.

The size of the structures that can be produced depends crucially on the resolving power of the employed projection lens and the latter can be increased, firstly, by reducing the wavelength of the projection radiation used for the projection and, secondly, by increasing the image-side numerical aperture NA of the projection lens used in the process. These days, projection exposure apparatuses including high-resolution projection lenses operate at wavelengths of less than 260 nm in the deep ultraviolet (DUV) range or in the extreme ultraviolet (EUV) range.

Projection lenses generally have a multiplicity of optical elements in order to meet partly conflicting desired properties with regard to the correction of imaging aberrations possibly even with large numerical apertures used. Both refractive and catadioptric projection lenses in the field of microlithography often have ten or more transparent optical elements. In systems for EUV lithography it is endeavoured to manage with the fewest possible reflective elements, e.g. with four or six mirrors.

Besides the intrinsic imaging aberrations that a projection lens may have on account of its optical design and production, imaging aberrations may also occur during the use period, in particular during the operation of a projection exposure apparatus on the part of the user. Such imaging aberrations are often caused by changes in the optical elements installed in the projection lens as a result of the projection radiation employed during use. This is often dealt with under the key words "lens heating". Other internal or external disturbances can also lead to the impairment of the imaging performance. They include, inter alia, a possible scale error of the mask, changes in the air pressure in the surroundings, differences in the strength of the gravitational field between the location of the original lens adjustment and the location of use by the customer, changes in refractive index and/or shape alterations of optical elements on account of material alterations as a result of high-energy radiation (e.g. compaction), deformations on account of relaxation processes in the holding devices, drifting of optical elements and the like.

Modern projection exposure apparatuses for microlithography include an operating control system, which allows a near-instantaneous fine optimization of imaging-relevant properties of the projection exposure apparatus to be performed in reaction to environmental influences and other disturbances. For this purpose, at least one manipulator is actuated in a manner appropriate to the current system state in order to counteract a disadvantageous effect of a disturbance on the imaging performance. In this case, the system state can be estimated e.g. on the basis of measurements, from simulations and/or on the basis of calibration results or can be determined in some other way.

The operating control system includes a subsystem—belonging to the projection lens—in the form of a wavefront manipulation system for dynamically influencing the wavefront of the projection radiation travelling from the object plane to the image plane of the projection lens. In the course of dynamic influencing, the effect of the components of the wavefront manipulation system arranged in the projection beam path can be adjusted in a variable manner depending on control signals of the operating control system, as a result of which the wavefront of the projection radiation can be modified in a targeted manner. The optical effect of the wavefront manipulation system can be modified in the case of e.g. specific, predefined occasions or in a manner dependent on the situation prior to an exposure, or else during an exposure.

The wavefront manipulation system includes at least one manipulator having at least one manipulator surface arranged in the projection beam path. In this case, the term "manipulator" denotes devices configured, on the basis of corresponding control signals of the operating control system of the projection exposure apparatus, to actively influence individual optical elements or groups of optical elements in order to change the optical effect thereof, in particular change it in such a way that an aberration that occurs is at least partly compensated for.

A manipulator contains one or more actuating members or actuators, the current manipulated value of which can be changed or adjusted on the basis of control signals of the operating control system as a result of a manipulated value change. A manipulated value change can bring about e.g. a displacement or deformation of an optical element. If a manipulated value change is a movement of an actuator, e.g.

in order to displace or tilt an optical element, then a manipulated value change can also be referred to as "manipulator travel". A manipulated value change can also be present e.g. as a temperature change or as a change in an electrical voltage.

A manipulated value change brings about a change in the imaging properties that can be influenced by the manipulator (at least one). The efficacy of a manipulator vis-à-vis specific imaging aberrations is usually described by the so-called "sensitivity" of the manipulator to the imaging aberrations. The term sensitivity describes the relationship between a defined manipulated value change at a manipulator and the effect achieved thereby on the imaging quality or on lithographic aberrations.

In known operating control systems, the manipulated value changes at manipulators, or at actuators of manipulators, which are involved for a desired intervention in the system are determined on the basis of a control programme with a correction algorithm which optimizes a target function (merit function). What is thus intended to be achieved, inter alia, is that, rather than an individual residual aberration being minimized at the cost of others, an expedient, balanced reduction of all relevant influencing variables occurs.

The European patent EP 1 251 402 B1 describes an operating control system which uses a target function. In this case, the target function describes the quality of the exposure process as a weighted sum of a multiplicity of "lithographic aberrations". In this case, the term "lithographic aberration" is intended to encompass all defects relevant to lithography during the imaging. The lithographic aberrations include, inter alia, aberrations such as distortion (non-uniform displacement of image points in the image field), deviations of the lateral image position (uniform displacement of image points in the image field), image rotation, asymmetrical imaging scale, deformations of the focus position (non-uniform image point displacement perpendicular to the image plane), etc., but also variations of the critical dimensions over the image field (CD variations), differences in the critical dimensions in mutually orthogonal directions (HV aberrations), etc. In general, these aberrations are not uniform over the image field, but rather vary within the image field. Distortion and deformations of the focal plane can lead to overlay aberrations (e.g. overlay aberrations between different patterns (or mask structures) and focus aberrations. The lithographic aberrations are influenced by various properties of the projection exposure apparatus or of the projection exposure process, including the substrate, the radiation-sensitive layer on the substrate, the projection ray provided by the light source, the mask and the projection system.

As the structure sizes to be produced are becoming smaller and smaller, lithographic aberrations that are still acceptable in the case of larger structures can also become important.

SUMMARY

There is a desire for an improved control and the possibility for further reduction of lithographic aberrations in microlithographic projection exposure methods.

The disclosure seeks to provide a projection exposure method and a projection exposure apparatus for microlithography which allow different photolithographic processes to be carried out under different operating conditions with a low level of lithographic aberrations. In particular, the intention is for good control and limitation of overlay aberrations to be possible. Furthermore, the intention is to provide a projection lens which can be used, inter alia, in the context of the projection exposure method and the projection exposure apparatus.

In one aspect, the disclosure provides a projection exposure method for exposing a radiation-sensitive substrate with at least one image of a pattern of a mask under the control of an operating control system of a projection exposure apparatus. The method includes the following steps: holding the mask between an illumination system and a projection lens of the projection exposure apparatus in such a way that the pattern is arranged in the region of the object plane of the projection lens; holding the substrate in such a way that a radiation-sensitive surface of the substrate is arranged in the region of an image plane of the projection lens optically conjugate to the object plane; illuminating an illumination region of the mask with an illumination radiation provided by the illumination system; projecting part of the pattern lying in the illumination region onto an image field on the substrate with the aid of the projection lens, wherein all rays of the projection radiation contributing to the image generation in the image field form a projection beam path; and influencing the wavefront of the projection radiation by actuating a manipulator which has a manipulator surface arranged in the projection beam path and an actuating device for reversibly changing an optical effect of the manipulator surface. Manipulated value changes of the actuating device are determined by the operating control system on the basis of a control programme with a correction algorithm which optimizes a target function. The target function for at least one manipulator includes a telecentricity sensitivity, wherein the telecentricity sensitivity describes a relationship between a defined manipulated value change at the manipulator and an effect achievable thereby on the telecentricity of the projection radiation in the image field.

In one aspect, the disclosure provides a projection exposure apparatus for exposing a radiation-sensitive substrate with at least one image of a pattern of a mask. The apparatus includes: an illumination system (ILL) for receiving primary radiation of a primary radiation source and for generating an illumination radiation (ILR) directed onto the mask (M) in an illumination region; a projection lens (PO) projecting a part of the pattern that lies in the illumination region onto an image field at the substrate with projection radiation; a mask holding device (RST) for holding the mask between the illumination system and the projection lens in such a way that the pattern is arranged in the region of an object plane (OS) of the projection lens; a substrate holding device (WST) for holding the substrate in such a way that a radiation-sensitive surface of the substrate is arranged in the region of the image plane (IS) of the projection lens optically conjugate to the object plane; an operating control system configured to control the operation of the projection exposure apparatus; and a wavefront manipulation system (WFM) for dynamically influencing the wavefront of the projection radiation travelling from the object plane to the image plane. The wavefront manipulation system comprises a manipulator (MAN) which is actuatable by control signals of the operating control system and which has a manipulator surface (MS) arranged in the projection beam path and an actuating device (DR) for reversibly changing an optical effect of the manipulator surface. Telecentricity sensitivities ($S(Z1)$) of manipulators for varying the telecentricity are stored in a memory (SP) of the operating control system. A telecentricity sensitivity describes a relationship between a defined manipulated value change at a manipulator and the effect achieved thereby on the telecentricity of the projection lens. The operating control system is configured such that the operation of the projection exposure apparatus is controllable taking account of the telecentricity sensitivities.

In one aspect, the disclosure provides a projection lens (PO) for imaging a pattern arranged in an object plane (OS) of the projection lens into an image plane (IS) of the projection lens by means of electromagnetic radiation. The projection lens includes: a multiplicity of optical elements with optical surfaces which are arranged in a projection beam path between the object plane (OS) and the image plane (IS) in such a way that a pattern arranged in the object plane is imageable in the image plane via the optical element; and a wavefront manipulation system (WFM) for dynamically influencing the wavefront of the projection radiation travelling from the object plane to the image plane. The projection lens comprises at least one dedicated telecentricity manipulator.

The disclosure is based, inter alia, on the following considerations and insights.

Nowadays, projection lenses for microlithography are usually designed as telecentric lenses. A telecentric lens is distinguished by the fact that the entrance pupil and/or the exit pupil are/is at infinity. A distinction is drawn between object-side telecentricity, image-side telecentricity and telecentricity on both sides. A beam path which is telecentric on the object side is used to capture objects without perspective distortion. The entrance pupil is at infinity, such that the chief rays in the object space all travel perpendicularly to the object plane or parallel to the optical axis. The imaging scale does not change in the case of axial object displacement. The image thus always appears to be of the same size independently of the object distance. In the case of a beam path which is telecentric on the image side, the exit pupil is at infinity, such that the ray cones all impinge perpendicularly on the image plane. A beam path which is telecentric from both sides (doubly telecentric) is the combination of beam path which is telecentric on the object side and beam path which is telecentric on the image side. Entrance and exit pupils are at infinity; therefore, the system is afocal. The image plane can theoretically be refocused without changing the imaging scale. Projection lenses which are telecentric on both sides are insensitive to defocusing.

Nowadays, projection lenses for microlithography having operating wavelengths in the DUV range are usually designed to be doubly telecentric (telecentric on both sides) in order to meet desired properties made of the imaging scale. If the projection lens is telecentric in the object space (on the object side, object-side telecentricity) and in the image space (on the image side, image-side telecentricity), this reduces the sensitivity of the imaging scale to the height adjustment both of the reticule and of the wafer.

In the case of projection lenses for microlithography having operating wavelengths in the EUV range that are constructed exclusively with mirrors, reflective masks are employed which involve oblique illumination. Here telecentricity is possible only in the image space (image-side telecentricity).

During the operation of the projection exposure apparatus, individual lens elements and/or other optical elements of the projection lens (e.g. mirrors) are manipulated, e.g. moved out of their nominal position and/or deformed, e.g. in order to compensate for environmental disturbances, such as change in pressure, and/or other disturbances. In the case of "manipulations" of the optical unit, the telecentricity is disregarded in conventional operating control systems. This can have the effect that the telecentricity is significantly adjusted and e.g. scale errors are induced.

Although there are possibilities for measuring the telecentricity of an isolated projection lens (cf. e.g. DE 102005026628 A1), to the inventors' knowledge there currently exists no measurement technique for telecentricity control of a projection lens incorporated into a projection exposure apparatus during the operation of the projection exposure apparatus.

One known calculation of telecentricity is based on the following method: The centroid rays (centroid in the pupil coordinates) are determined by aiming at the system stop. The deviation of the centroid ray direction from the desired 90° direction is referred to as the telecentricity error. This error is generally indicated in millirad (mrad). Projection lenses for microlithography often have a nominal telecentricity error in the range of approximately 1 mrad to 0.1 mrad.

By contrast, known measurement techniques in projection exposure apparatuses are based on wavefront data (e.g. interferometer measurement technique for determining the phase) and are therefore not compatible with ray data. In the case of an operating control system which is based on wavefront measurements, it is not possible to use the sensitivities of the directions of the centroid rays in the software used (lens model).

To the inventor's knowledge, moreover, no attempts have previously been made to take account of the telecentricity in the calculation of the manipulated value changes of the manipulatable optical elements.

In accordance with the disclosure, the target function to be optimized by the control programme is modified in relation to conventional target functions, such that the target function for at least one manipulator includes a telecentricity sensitivity, wherein the telecentricity sensitivity describes a relationship between a defined manipulated value change at the manipulator and an effect achievable thereby on the telecentricity of the projection radiation in the image field. Preferably, a telecentricity sensitivity is taken into account for each manipulator.

The optimization of the target function normally involves simulating numerous manipulated value changes of manipulators and calculating the effects thereof on the target function. If the procedure in accordance with the disclosure is adopted, then the effects of manipulated value changes at manipulators on the telecentricity can be taken into account in the optimization of the target function. What can thereby be achieved, for example, is that an end customer (user of the projection exposure apparatus), without telecentricity measurement, is afforded a possibility of documenting the deviation of the telecentricity from the telecentricity of the delivery state and a subsequent adjustment by manipulators, and of ensuring that the telecentricity remains in the range of a predefined specification.

In the field of geometric optics, Zernike polynomials are usually used to represent wavefronts, which in turn describe the imaging aberrations of optical systems. In this case, the individual imaging aberrations can be described by the coefficients of the Zernike polynomials, that is to say the Zernike coefficients or the values thereof (in [nm]). In a representation that is customary in the field of lithography, e.g. the Zernike coefficients Z2 and Z3 represent the tilt of a wavefront in the x-direction and y-direction, respectively, as a result of which a distortion-like aberration arises. The Zernike coefficient Z4 describes a curvature of the wavefront, whereby a defocus aberration is describable. The Zernike coefficient Z5 describes a saddle-shaped deformation of the wavefront and thus the astigmatism portion of a wavefront deformation. The Zernike coefficients Z7 and Z8 stand for coma, the Zernike coefficient Z9 stands for spherical aberration, and the Zernike coefficients Z10 and Z11 stand for third-order aberration, etc.

The Zernike coefficient Z1, which describes a constant displacement of the wavefront, has not been taken into consideration hitherto in the adjustment of a projection lens for microlithography. Such a displacement leads to a temporal delay, that is to say to a change in the optical path length (OPL) of the rays, but not to a deformation of the wavefront. A Z1 variation over the field leads to aberrations only in association with a defocusing of the image plane or of the object plane, but not in the normal position (without defocusing). It is assumed that for this reason, inter alia, field variations of Z1 are not routinely calculated in customary optical design programmes, such as e.g. CODE V®, OSLO® or ZEMAX®.

The inventor has recognized that the field profile of the Zernike coefficient Z1 (or a variable mathematically equivalent thereto) can be used as a dimension figure for telecentricity. The field profile of the Zernike coefficient Z1 quantitatively describes how the Zernike coefficient Z1 changes over the effective image field, that is to say the dependence of Z1 on the position or on the field coordinates in the image field. The field profile of the Zernike coefficient Z1 is a variable which is in an unambiguous calculatable relationship with the telecentricity and in this respect defines the latter or makes it calculatable from wavefront data.

It is possible to calculate the sensitivities of the field profile of the Zernike coefficient Z1 to manipulations and to implement them in existing models of the operating control. This makes it possible to determine quantitatively how a manipulated value change at a manipulator effects the field profile of the Zernike coefficient Z1 (and thus the telecentricity).

The sensitivities of the field profile of the Zernike coefficient Z1 to movements of lens elements or other manipulated value changes at manipulators can be described in a format which corresponds to the format of conventional manipulator software in lithography lenses. An implementation in existing systems is possible as a result.

In projection exposure apparatuses including manipulators, one possibility for taking account of variations or changes in the telecentricity in the control of a projection exposure apparatus consists in also storing telecentricity sensitivities, i.e. sensitivities of manipulators for the variation of the telecentricity, in a correction algorithm of the operating control system or in determining such sensitivities and storing them in a memory of the operating control system and controlling the operation of the projection exposure apparatus taking account of the telecentricity sensitivities.

If it emerges here for example that even a small manipulated value change of a manipulator leads to a great shift in the telecentricity into a critical region, it is possible to limit manipulated value changes of the manipulator taking account of the telecentricity sensitivity to relatively small magnitudes in order that the lithographic aberrations caused by a variation of the telecentricity are kept sufficiently small. This can be achieved by limiting permissible manipulated value changes of a manipulator, taking account of the telecentricity sensitivities, to magnitudes below a manipulated value limit value by a control engineering mechanism. This measure has the effect that a permitted manipulated value range, the so-called "range" of a manipulator, when taking account of telecentricity sensitivities can change in comparison with a projection exposure apparatus without taking account of the telecentricity sensitivities.

A telecentricity determination equivalent to the field profile of the Zernike coefficient Z1 is possible, for example, if an OPL surface conjugate to the object surface is calculated during the optimization of the target function, the OPL surface being defined by a totality of image points which are at an optical distance of constant optical path length (OPL) from conjugate object points. By way of example, a profile of a constant displacement of the wavefront of the projection radiation over the image field can be calculated for the determination of the OPL surface.

The disclosure affords for the first time the possibility for the telecentricity control of a projection lens incorporated in a projection exposure apparatus during the operation of the projection exposure apparatus. For this purpose, by way of example, the following steps can be carried out: determining a start value for the telecentricity at a start time; calculating telecentricity changes caused by adjustment of manipulators using values for manipulated value changes of the manipulators and assigned telecentricity sensitivities; determining a telecentricity value for a determination time from the start value and the telecentricity changes effected between the start time and the determination time. The start value can be determined e.g. by measuring the telecentricity upon start-up or after a readjustment. A sensitivity-based telecentricity monitor can be realised as a result.

For the case where the telecentricity can be measured, it is possible to use the Z1 sensitivities for the adjustment of the telecentricity. This means, inter alia, that the travels of the manipulators can be determined, such that the telecentricity has a desired profile.

It may suffice to determine with sufficient accuracy in what way and to what extent the telecentricity changes during operation e.g. on account of manipulated value changes on manipulators. Some embodiments provide for the telecentricity of the projection lens to be varied by actuating at least one dedicated telecentricity manipulator. The term "dedicated telecentricity manipulator" here means that this is a manipulator which can cause a targeted variation of the telecentricity of the projection lens in reaction to control signals of an operating control system, wherein the influence on the telecentricity predominates in comparison with likewise possible influences on other aberrations, such as distortion and defocus, for example.

The provision of a dedicated telecentricity manipulator for the projection lens or the provision of a projection lens with a dedicated telecentricity manipulator can also be an independent disclosure independently of a telecentricity control or of taking account of telecentricity sensitivities.

The disclosure also relates to a projection lens for microlithography including a dedicated telecentricity manipulator, and to a projection exposure apparatus including such a projection lens. It is thus possible, as desired during an adjustment operation or during the operation of the projection exposure apparatus, to vary the telecentricity properties of the projection lens in a targeted manner, without at the same time necessarily likewise varying other aberrations, such as e.g. distortion and defocus, to a relevant extent.

Advantageous concepts for the construction of dedicated telecentricity manipulators are explained in greater detail below in association with detailed exemplary embodiments.

BRIEF DESCRIPTION OF THE DRAWINGS

Further advantages and aspects of the disclosure are evident from the claims and from the following description of preferred exemplary embodiments of the disclosure, which are explained below with reference to the figures.

FIGS. 1A-1B schematically show how an ideal imaging system transforms an incoming spherical wave into an outgoing spherical wave, wherein FIG. 1A describes a doubly telecentric imaging system and FIG. 1B describes a non-doubly telecentric imaging system;

FIGS. 2A-2C show the profile of surfaces of constant optical path length (OPL surfaces) for a doubly telecentric imaging system with different ray directions in FIGS. 2A and 2B and for a non-doubly telecentric imaging system in FIG. 2C;

FIGS. 3A-3B show an illustration which depicts the surfaces of constant OPL (OPL surface) for selected field points and for selected spatial directions (dashed lines), wherein the OPL surface is a plane in the image space in the doubly telecentric case (FIG. 3A) and is curved in the image in the non-doubly telecentric case (FIG. 3B);

FIG. 6) and in FIG. 8B the derivatives of the functions from FIG. 8A;

DETAILED DESCRIPTION OF THE EXEMPLARY EMBODIMENTS

Figure 4:
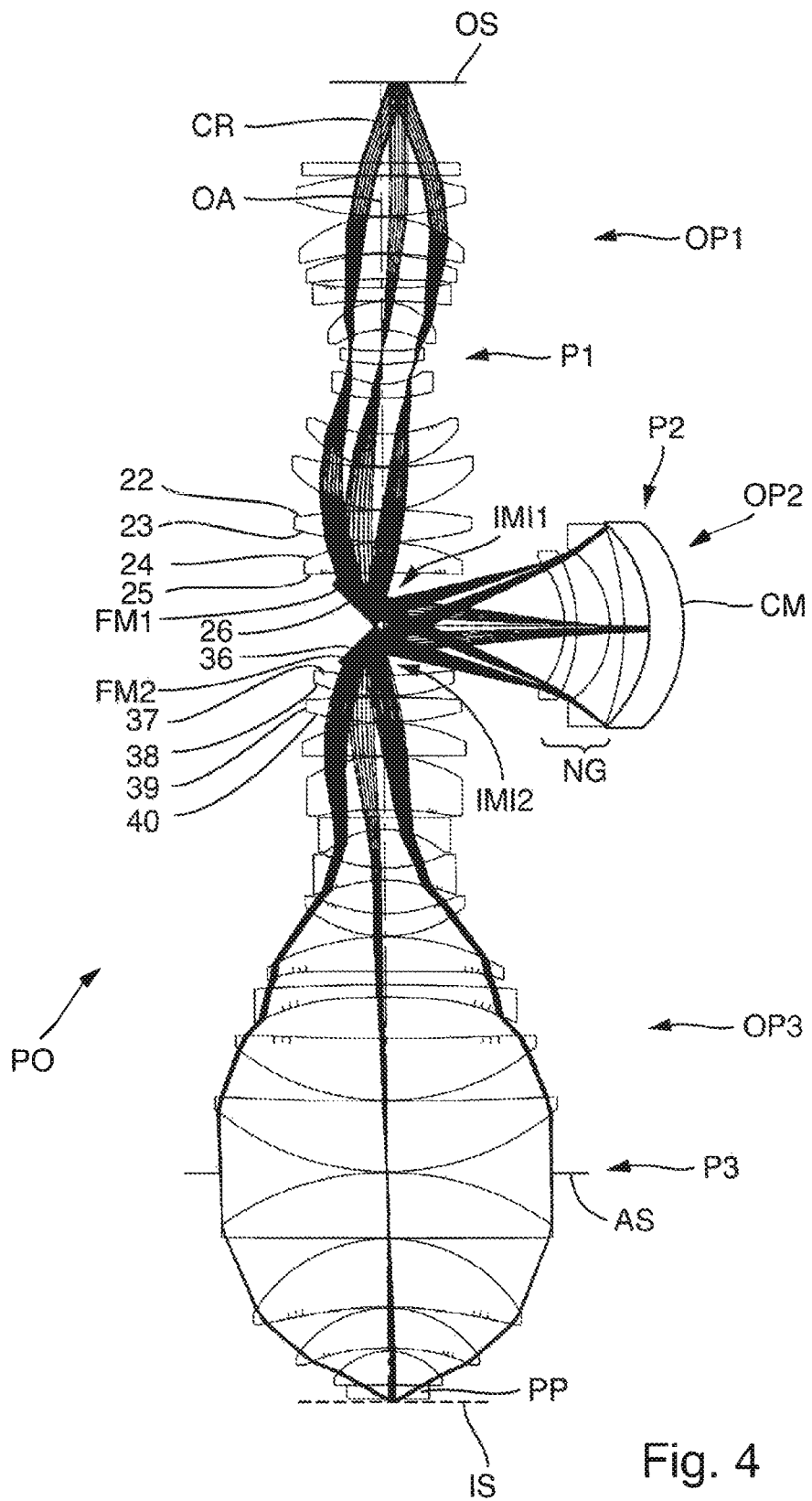
FIG. 4 shows a schematic meridional lens element sectional view of a reference system in the form of a catadioptric projection lens.

In order to provide a more detailed explanation of the background of aspects of the claimed disclosure, firstly an explanation is given below of relationships between telecentricity properties of an optical imaging system and alternative modes of description, such as the field profile of the Zernike coefficient Z1 or the OPL function.

The textbook "An Introduction to Hamiltonian Optics" by H. A. Buchdahl, Cambridge University Press (1970) shows that an optical system can be completely characterized by a scalar function with the designation "characteristic". The mixed characteristic $W_1$ is particularly suitable for an imaging system. This function corresponds to the sum of the optical path lengths OPL indicated in the direction cosines in the object plane and the spatial coordinates in the image plane with the weighted scalar product of the start locations and start directions, $$W_1(k_x, k_y; X, Y) := \text{OPL}(k_x, k_y; X, Y) + n_o(k_x x + k_y y)$$

wherein the convention was chosen that the coordinates in the object space are described as lowercase letters and the coordinates in the image space are described as uppercase letters.

The combination of the characteristics to form the ray data follows from Fermat's principle. Specifically, the derivatives of $W_1$ with respect to the direction cosines in the object plane yield the intersection points of the rays at this plane scaled with the refractive index $n_o$ $$\frac{\partial}{\partial k_x} W_1(k_x, k_y; X, Y) = n_o x$$

$$\frac{\partial}{\partial k_y} W_1(k_x, k_y; X, Y) = n_o y$$

and the derivatives with respect to the locations in the image plane yield the direction cosines in the corresponding plane scaled with the refractive index $N_B$ $$\frac{\partial}{\partial X} W_1(k_x, k_y; X, Y) = N_B K_X$$

$$\frac{\partial}{\partial Y} W_1(k_x, k_y; X, Y) = N_B K_y$$

The ideal, aberration-free characteristic of an optical system with the imaging scale can be written as $$W_{ideal}(k_x, k_y; X, Y) = \frac{n_0}{\beta}(X k_x + Y k_y) + R(X, Y)$$

This follows from the differential equations $(\partial W/\partial k_x)$ and $(\partial W/\partial k_y)$ if the imaging conditions $$X = \beta x \text{ and } Y = \beta y$$

are taken into account. The aberrations of an optical system are described as the deviations of the $W_1$ characteristic from the ideal characteristic where $$W_{Aberration} = W_1 - W_{ideal}$$

That is the wavefront aberration that is obtained as a result in optical design programmes such as e.g. OSLO®, CODEV® or ZEMAX®. All these programmes can only calculate an approximation of the wavefront aberration.

Considerations with regard to telecentricity will now follow. In previously examined texts concerning the wavefront aberration, the term $R(X, Y)$ in the equation for ($W_{ideal}$) is argued away since it does not contribute to the imaging quality. This term becomes important, however, if statements concerning the telecentricity of an optical system are intended to be made. Specifically, if the ideal characteristic is inserted into the equations $(\partial W/\partial k_x)$ and $(\partial W/\partial k_y)$, then the following is obtained:

$$\frac{\partial}{\partial X} W_{ideal}(k_x, k_y, X, Y) = \frac{n_0}{\beta} k_x + \frac{\partial}{\partial X} R(X, Y) \stackrel{!}{=} N_B K_X$$

$$\frac{\partial}{\partial Y} W_{ideal}(k_x, k_y, X, Y) = \frac{n_0}{\beta} k_y + \frac{\partial}{\partial Y} R(X, Y) \stackrel{!}{=} N_B K_y$$

These equations correspond to the sine condition. They state that the variation of the ray direction in the image space is proportional to the variation of the ray direction in the object space. The proportionality constant is the inverse of the imaging scale $\beta$.

For a doubly telecentric optical unit, the rays that start perpendicularly in the object ($k_x=0$, $k_y=0$), arrive perpendicularly in the image concomitantly ($K_x=0$, $K_y=0$). These conditions are met if $R(X, Y)$ is constant. This shows that the telecentricity of an optical system is described by the term $R(X, Y)$.

Moreover, the ideal characteristic for doubly telecentric lenses have the following form:

$$W_{ideal}(k_x, k_y, X, Y) = \frac{n_0}{\beta}(Xk_x + Yk_y) + c$$

wherein c represents an arbitrary constant.

Projection lenses for microlithography via EUV radiation (EUV optical units) cannot be doubly telecentric because the masks are reflective. The beams in such systems start at the object plane at a fixed chief ray angle $\alpha$, which is generally a few degrees (e.g. between 3° and 10°, e.g. approximately 6°). The EUV optical units are telecentric, however, in the image plane (only image-side telecentricity). For the ideal characteristic this corresponds to the properties $$\frac{\partial}{\partial X}W_{ideal}(k_x = 0, k_y = \alpha; X, Y) = \frac{\partial}{\partial X}R(X, Y) = 0$$

$$\frac{\partial}{\partial y}W_{ideal}(k_x = 0, k_y = \alpha; X, Y) = \frac{n_0}{\beta}\alpha + \frac{\partial}{\partial Y}R(X, Y) = 0$$

The solution to these equations reads $$R(X, Y) = \frac{n_0}{\beta}\alpha Y + c$$

wherein c is an arbitrary constant. Using similar arguments, the properties for the ideal profile of the function $R(X, Y)$ can easily also be derived for systems which are not telecentric on both sides.

The combination for Zernike expansion can be understood as follows. The wavefront aberrations ($W_{aberration}$) are typically expanded into Zernike polynomials $Z_n(k_x, k_y)$ where $$W_{Aberration}(k_x, k_y; X, Y) = \sum_{n=1}^{N} c_n(X, Y)Z_n(k_x, k_y)$$

this expansion has an attractive interpretation since the Zernike polynomials can be interpreted as known image aberrations. By way of example, $Z_2$ and $Z_3$ correspond to the distortion and $Z_4$ corresponds to the defocus of an optical unit.

The Zernike polynomial $Z_1$ corresponds to a constant and the field profile of the Zernike coefficient $c_1(X, Y)$ thus corresponds to the profile of the telecentricity.

The Z1 term is disregarded in all of the optical design programmes (OSLO®, ZEMAX® and CODEV®) tested by the inventor. It is assumed that this is owing to historical development in optical design, inter alia. Traditionally a design is assessed point by point. The global phase corresponding to the Z1 is unimportant at a fixed point (X, Y). Therefore, in the programmes mentioned above, the global phase at a point is chosen such that the wavefront aberration in the centre of the pupil vanishes. This makes it impossible to calculate the Z1 field profile.

A visual representation of the results is presented below with reference to FIGS. 1 to 3. The fact that the characteristic $W_1(k_x, k_y; X, Y)$ is dependent on four variables makes it difficult to represent it. If two of the variables are fixed, however, then it becomes possible to give a simple physical interpretation.

A representation in which the incidence location (X, Y) is fixed is usually chosen. This corresponds to the procedure supported by all optical design programmes. In this case, field points (fixed incidence locations) are defined, at which the wavefront aberrations are then controlled. In this case, the ideal characteristic (equation for ($W_{ideal}$)), as is depicted schematically in FIG. 1A, shows that the OPL is constant for all rays that start in directions ($k_x$, $k_y$). The surfaces of the constant OPL—also referred to as OPL surface—are thus spherical. The desired property that an ideal optical unit transforms an incoming spherical wave into an outgoing spherical wave is obtained as a result.

For fixed incidence locations (X,Y), the ideal characteristic reduces to a linear function $W_{ideal}=c_1 k_x+c_2 k_y+c_0$ in the direction cosines $k_x$ and $k_y$, and represents a spherical wave. If the ideal characteristic is considered only at a point, then the doubly telecentric lenses (FIG. 1A) cannot be distinguished from the non-doubly telecentric lenses (FIG. 1B).

However, if consideration is given to the unusual case, not taken into account hitherto, in which the directions ($k_x$, $k_y$) are fixed, then the desired property that plane surfaces of the constant OPL in the object space are imaged onto plane surfaces in the image space is obtained from the formula for the ideal characteristic of a doubly telecentric system (equation for ($W_{ideal-doublyTel}$)). This relationship is depicted schematically in FIGS. 2A-2C. For fixed start directions ($k_x$,$k_y$), the ideal characteristic for doubly telecentric systems $$W_{ideal} = \frac{n_0}{\beta}(Xk_x + Yk_y) + c$$

can be written as a linear function in the incidence locations (X,Y), which corresponds to a plane.

The schematic depictions in FIGS. 2A and 2B show the profile of the surfaces of the constant OPL for ($k_x=0$, $k_y=0$) (FIG. 2A) and ($k_x \neq 0$, $k_y \neq 0$) (FIG. 2B). For non-doubly telecentric systems (FIG. 2C) having the characteristic $$W_{ideal} = \frac{n_0}{\beta}(Xk_x + Yk_y) + R(X, Y),$$

the surface of the constant OPL in the image space corresponds to the function R(X,Y).

In FIG. 3A-3B, a representation is chosen which depicts the surfaces of the constant OPL (OPL surface) for selected field points and also for selected spatial directions (dashed lines). In this representation, doubly telecentric systems can be clearly distinguished from the systems which are telecentric on the object side.

The dashed lines in both figures show the profile of the surface having constant OPL for ($k_x=0$,$k_y=0$). In the doubly telecentric case (FIG. 3A), this surface is a plane in the image space. For the non-doubly telecentric case (FIG. 3B), this surface is curved in the image.

An explanation is given below of quantitative aspects concerning sensitivities of Z1 for the design of an operating control and for the design of manipulators for influencing the telecentricity on the basis of practical examples.

FIG. 4 shows a schematic meridional lens element sectional view of an embodiment of a catadioptric projection lens PO with selected beams for elucidating the imaging beam path of the projection radiation passing through the projection lens during operation. The projection lens is provided as an imaging system with a reducing effect, for imaging, with a reduced scale, for example with the scale of 4:1, a pattern of a mask arranged in its object plane OS onto its image plane IS aligned parallel to the object plane. Here, exactly two real intermediate images IMI1, IMI2 are produced between object plane and image plane. A first lens part OP1, which is constructed exclusively with transparent optical elements and is therefore refractive (dioptric), is designed in such a way that the pattern of the object plane is imaged into the first intermediate image IMI1 substantially without any change in size. A second, catadioptric lens part OP2 images the first intermediate image IMI1 onto the second intermediate image IMI2 substantially without any change in size. A third, refractive lens part OP3 is designed to image the second intermediate image IMI2 with great reduction into the image plane IS.

Pupil surfaces or pupil planes P1, P2, P3 of the imaging system respectively lie between the object plane and the first intermediate image, between the first and the second intermediate image and between the second intermediate image and the image plane, respectively where the chief ray CR of the optical imaging intersects the optical axis OA. The aperture stop AS of the system can be attached in the region of the pupil surface P3 of the third lens part OP3. The pupil surface P2 within the catadioptric second lens part OP2 lies in direct proximity to a concave mirror CM.

With regard to its optical construction, the exemplary embodiment shown in FIG. 4 is similar to the second exemplary embodiment in WO 2006/121008 A1 (corresponding to US 2009/092925 A1), that is modified by comparison therewith.

The catadioptric second lens part OP2 contains the sole concave mirror CM of the projection lens. A negative group NG having two negative lens elements is situated directly upstream of the concave mirror. In this arrangement, which is occasionally referred to as a Schupmann achromate, the Petzval correction, i.e. the correction of the image field curvature, is achieved as a result of the curvature of the concave mirror and the negative lens elements in the vicinity thereof, the chromatic correction as a result of the refractive power of the negative lens elements upstream of the concave mirror and also the stop position with respect to the concave mirror.

A reflective deflection device serves to separate the beam passing from the object plane OS to the concave mirror CM or the corresponding partial beam path from that beam or partial beam path which, after reflection at the concave mirror, passes between the latter and the image plane IS. For this purpose, the deflection device has a plane first deflection mirror FM1 having a first mirror surface (surface 26) for reflecting the radiation coming from the object plane to the concave mirror CM and a plane second deflection mirror FM2 aligned at right angles to the first deflection mirror FM1 and having a second mirror surface (surface 36), wherein the second deflection mirror deflects the radiation reflected from the concave mirror in the direction of the image plane IS. Since the optical axis is folded at the deflection mirrors, in this application the deflection mirrors are also referred to as folding mirrors. The deflection mirrors are tilted relative to the optical axis OA of the projection lens about tilt axes extending perpendicularly to the optical axis and parallel to a first direction (x-direction), e.g. by 45°. For this purpose, the deflection device is realized by a prism whose externally reflectively coated cathetus surfaces aligned perpendicularly to one another serve as deflection mirrors.

The intermediate images IMI1, IMI2 each lie in optical proximity to the deflection mirrors FM1 and FM2, respectively, closest to them, but can be at a minimum optical distance from them, such that possible defects on the mirror surfaces are not sharply imaged into the image plane, and the plane deflection mirrors (plane mirrors) FM1, FM2 lie in the region of moderate radiation energy density.

The positions of the (paraxial) intermediate images define field planes of the system which are optically conjugate to the object plane and to the image plane, respectively. The deflection mirrors thus lie in optical proximity to field planes of the system, which is also referred to as "near-field" in the context of this application. In this case, the first deflection mirror is arranged in optical proximity to a first field plane, belonging to the first intermediate image IMI1, and the second deflection mirror is arranged in optical proximity to a second field plane, optically conjugate to the first field plane and belonging to the second intermediate image IMI2.

The optical proximity or the optical distance of an optical surface with respect to a reference plane (e.g. a field plane or a pupil plane) is described by the so-called subaperture ratio SAR in this application. For the purposes of this application, the subaperture ratio SAR of an optical surface is defined as follows:

$$SAR = \text{sign } h(|r|/(|h|+|r|))$$

where r denotes the marginal ray height, h denotes the chief ray height and the signum function sign x denotes the sign of x, with sign 0=1 according to convention. The chief ray height is understood to mean the ray height of the chief ray of a field point of the object field with a maximum field height in terms of magnitude. The ray height should be understood to be signed. The marginal ray height is understood to mean the ray height of a ray with a maximum aperture proceeding from the point of intersection between the optical axis and the object plane. This field point need not contribute to transferring the pattern arranged in the object plane—in particular in the case of off-axis image fields.

The subaperture ratio is a signed variable which is a measure of the field or pupil proximity of a plane in the beam path. By definition, the subaperture ratio is normalized to values between −1 and +1, wherein the subaperture ratio is zero in each field plane and wherein the subaperture ratio jumps from −1 to +1, or vice versa, in a pupil plane. Therefore, a subaperture ratio with an absolute value of 1 determines a pupil plane.

An optical surface or a plane is then designated as "(optically) near" to an optical reference surface if the subaperture ratios of these two surfaces are comparable in terms of numerical value. In particular, an optical surface or a plane is designated "(optically) near-field" if it has a subaperture ratio that is close to 0. An optical surface or a plane is designated as "(optically) near-pupil" if it has a subaperture ratio that is close to 1 in terms of absolute value.

For both deflection mirrors it holds true that no optical element is arranged between the deflection mirror and the closest intermediate image (direct proximity) and that the subaperture ratio SAR, in terms of absolute value, is less than 0.3, in particular less than 0.2.

The projection lens PO has an image-side numerical aperture NA=1.35. The size of the effective image field is 26 mm×22 mm. The telecentricity deviation from perfect image-side telecentricity is less than 1 mrad.

Figure 5:
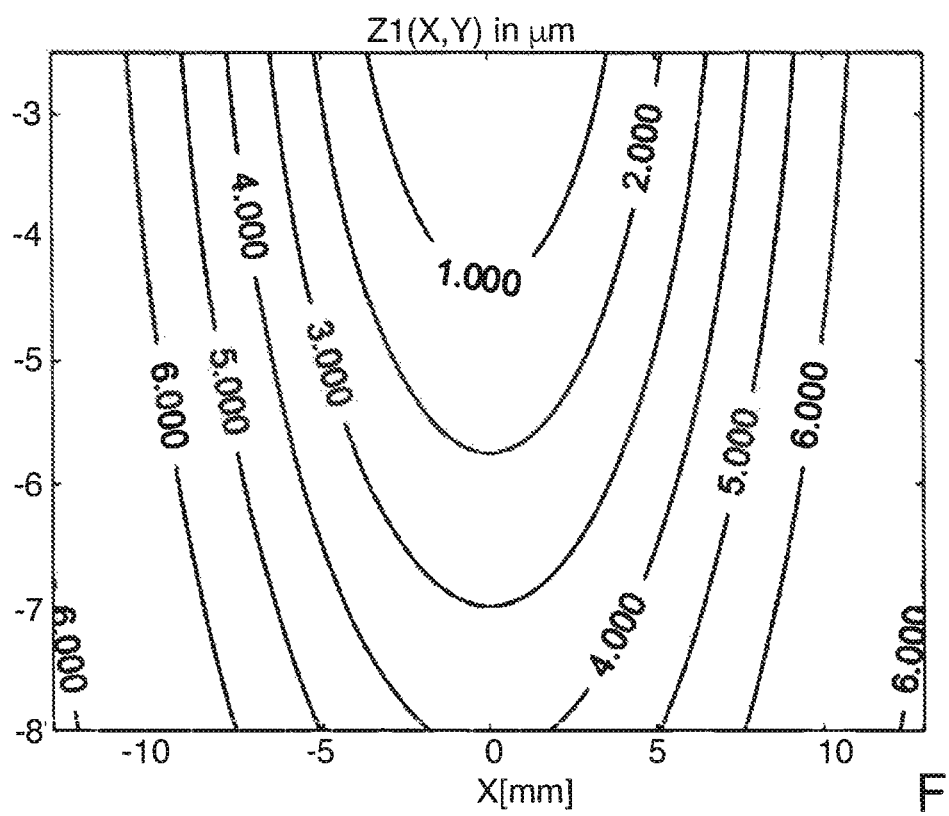
FIG. 5 schematically shows the profile of the Zernike coefficients Z1 as a function of the field coordinates x and y for the reference system in FIG. 4.
Figure 6:
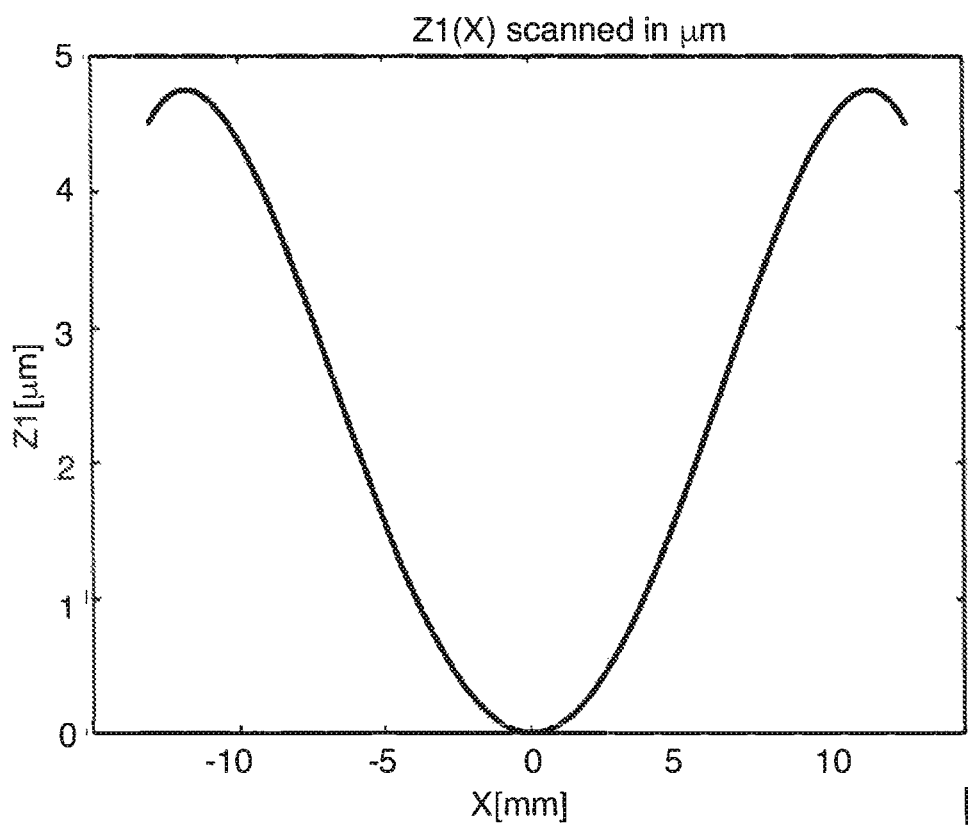
FIG. 6 shows the averaged profile of Z1 as a function of the x-coordinate for the reference system in FIG. 4.

FIG. 5 indicates the profile of the Zernike coefficients Z1 as a function of the field coordinates x and y for this reference system. The lines are lines of identical values for Z1 (X, Y) in micrometres. Since projection lenses with a slotted image field are usually used in scanning operation, the scanned profile of the aberration (averaged over the scanning direction (y-direction)) is of particular importance. FIG. 6 shows the averaged profile of Z1 as a function of the x-coordinate. These diagrams are intended primarily to elucidate the order of magnitude of an allowed Z1 variation on the basis of a system with well corrected telecentricity. In the case of such a projection lens having a telecentricity profile of the order of magnitude of 1 mrad, amplitudes of Z1 of the order of magnitude of approximately 5 μm are accordingly allowed. It is important to emphasize here that what is desired for the imaging is not the absolute value of the Z1 profile, but rather the gradient thereof.

Figure 7:
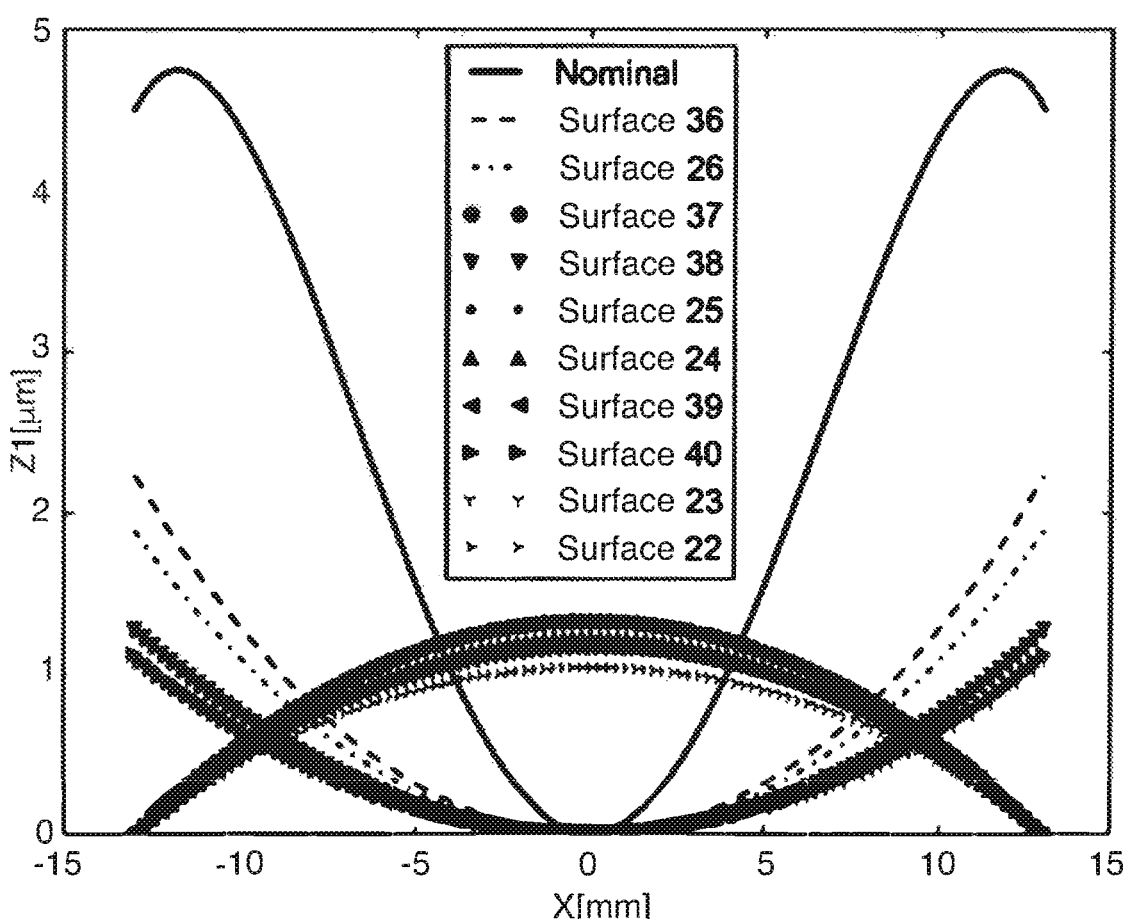
FIG. 7 shows the profiles of sensitivities of those optical surfaces of the reference system for which a variation of the surface shape leads to a particularly great change in the Z1 profile.

In order to determine to what extent changes at individual optical surfaces of the optical system affect the telecentricity, that is to say in order to determine the sensitivities of individual optical surfaces to the Z1 profile in the projection lens, there was added to each optical surface a parabolic profile of the form $x^2+y^2$ with a maximum amplitude of 2 μm in the optically free region of the respective optical surface. The difference between the new Z1 profile and the profile of the reference design was then determined in each case. The diagram in FIG. 7 shows the profiles of the ten highest sensitivities, i.e. of those optical surfaces for which a variation of the surface shape and/or a variation of the position or location (e.g. as a result of displacement parallel or perpendicular to the optical axis or as a result of tilting) lead(s) to a particularly great change in the Z1 profile. It is evident that the optical surfaces in proximity to the intermediate images IMI1, IMI2 at the deflection mirrors FM1, FM2 (cf. FIG. 4) have the highest sensitivity to the telecentricity (cf. FIG. 7B). The two deflection mirrors FM1, FM2 exhibit the highest sensitivity since they lie in direct proximity to the intermediate images and since as mirrors they have a higher optical sensitivity per se.

If it is taken into account that typical manipulated value changes or travels of manipulators can be of the order of magnitude of 1 or 2 μm, then it is directly evident from FIG. 7 that, in a worst case of manipulator manipulated value changes, the sum of the sensitivities can significantly exceed the nominal profile of Z1. This clearly shows an issue addressed in this application of the influencing of the telecentricity by manipulated value changes at manipulators of a projection lens.

Figure 8A:
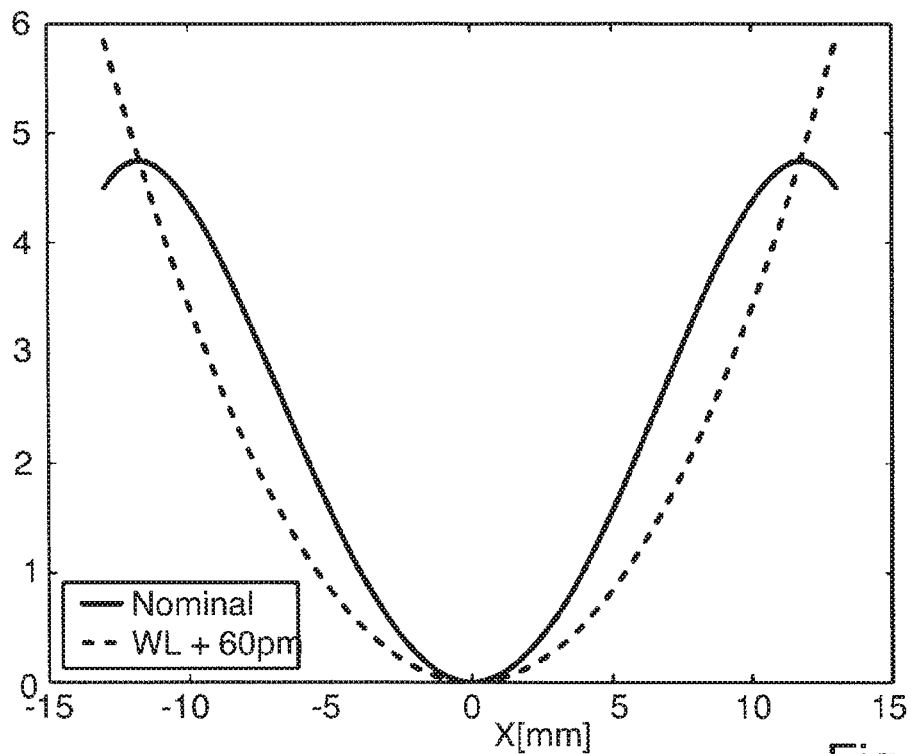
FIGS. 8A-8B show in FIG. 8A a diagram with a comparison of the sensitivity of Z1 with respect to a changed wavelength in comparison with the sensitivity in the case of the reference system (cf.
Figure 8B:
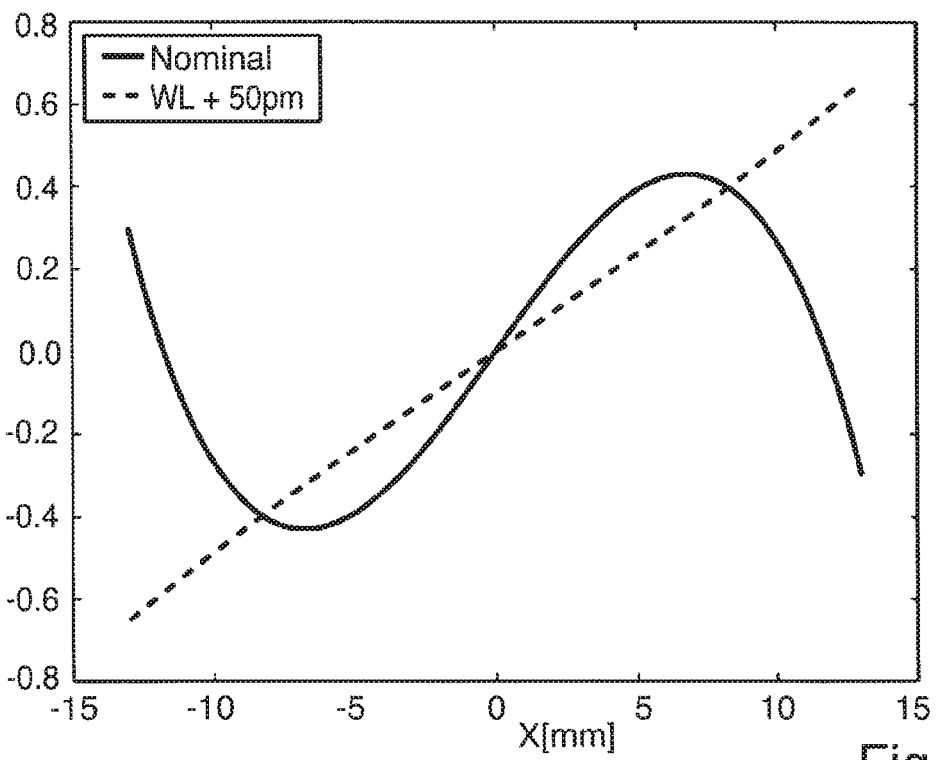

In some wavefront manipulation systems, a change in the operating wavelength is also used as a manipulator. By way of example, the wavelength in the case of great changes in air pressure in the vicinity of a projection exposure apparatus and the resultant changes in refraction time can be used as a manipulator. Experience shows that typical values for the wavelength changes can be in the range of ±50 μm. FIG. 8A shows a diagram with a comparison of the sensitivity of Z1 with respect to the changed wavelength in comparison with the sensitivity in the case of the reference system (cf. FIG. 6). FIG. 8B shows the derivatives of the functions from FIG. 8A. The derivatives correspond to the direction cosines of the rays in the image plane expressed in mrad. It is evident that during operation by virtue of the use of a manipulator that varies the wavelength of the used radiation in the specified order of magnitude, the telecentricity can more than double, for example, by comparison with the reference telecentricity.

The comprehensive analyses by the inventor, which are explained here only on the basis of a few examples, led to the following insights, inter alia: (i) the typical manipulated value changes that are used in many systems to highlight or compensate for external disturbances (for example on account of pressure variations) may be sufficient to significantly disturb the telecentricity. (ii) The Z1 profile can be controlled or set particularly effectively at near-field optical surfaces since the sensitivity for Z1 is particularly high here. (iii) The sensitivity for Z1 is all the greater, the smaller the numerical aperture at the optical surface respectively considered.

Taking account of the Z1 sensitivity (or other relationships suitable as telecentricity sensitivities) in the actuation of manipulators of an operating control system of a projection exposure apparatus is currently regarded as a good possibility for addressing this issue. It appears to be expedient to limit the Z1 to the smallest possible values, for example to the value 0, which would correspond to the ideal state. What can be achieved thereby is that the telecentricity is not adjusted to an arbitrarily great extent during operation, rather possible changes in the telecentricity properties are limited to relatively noncritical values.

The quantitative analyses show that typical orders of magnitude of the Z1 sensitivity are in the micrometres range. In comparison therewith, typical units of many other Zernike coefficients (which are normally in the nm range) are smaller by three orders of magnitude. It therefore appears to be expedient to provide the telecentricity or Z1 in the definition of the target function of a control with significantly smaller weights than those of other Zernike coefficients.

Considerations regarding criteria for the design of a dedicated telecentricity manipulator are explained below. The term "dedicated telecentricity manipulator" here means that this is a manipulator which can cause a targeted variation of the telecentricity of the projection lens in reaction to control signals of an operating control system, wherein the influence on telecentricity predominates in comparison with likewise possible influences on other aberrations, such as distortion and defocus, for example. In other words: A dedicated telecentricity manipulator allows a targeted variation of the telecentricity, wherein the level of other aberrations that are possibly likewise induced, in particular distortion and defocus, is low by comparison with the level of the variation of the telecentricity.

In some applications it may be advantageous for the manipulator to have, with respect to the telecentricity (quantified by Z1), a sensitivity that is greater than the sensitivity for Z2/Z3 by at least three orders of magnitude (at least a factor of 1000). There are also applications which deliberately do not use the projection lens in the best focus position, e.g. focus drilling. A difference in sensitivity by the factor of 10 or 100 may also be sufficient in those cases, inter alia.

Figure 9:
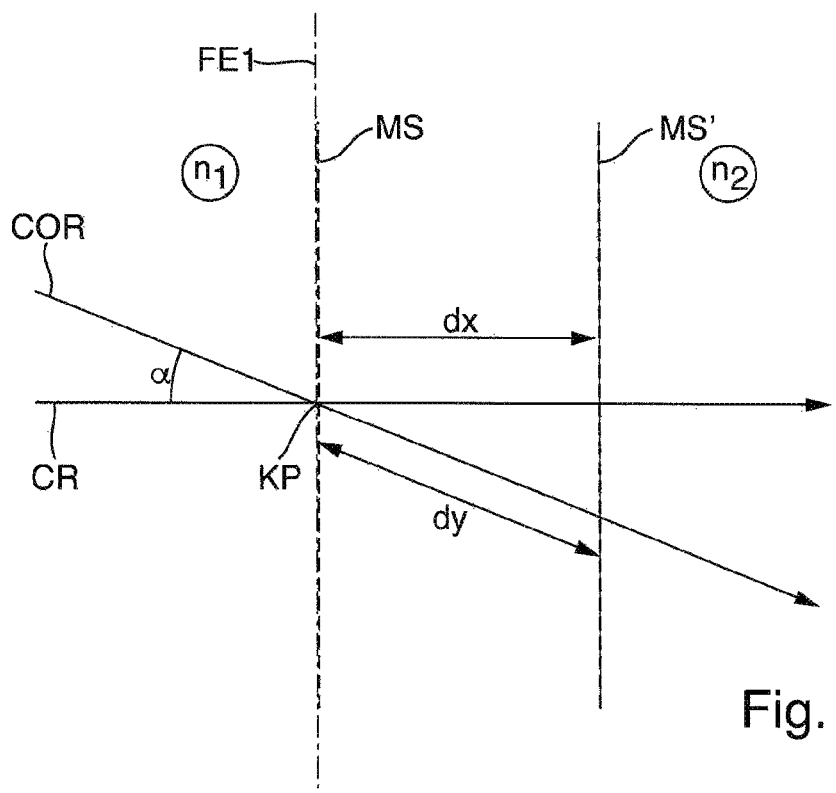
FIG. 9 schematically shows wave profiles of chief and coma rays at a manipulator surface of a telecentricity manipulator.

In order to elucidate the considerations, FIG. 9 schematically shows an excerpt from the projection beam path in the region of a field plane FE1 of the projection lens. The field plane can be for example an intermediate image plane optically conjugate to the object plane. In the case of an ideal optical imaging between the object plane and this field plane, the rays of a beam emanating from an object field point (field point in the object plane) would intersect in the intermediate image plane FE1 at a single intersection point KP. The projection beam path leading from left to right in FIG. 9 is represented in FIG. 9 by the chief ray CR (which in the region of the intermediate image plane ideally travels parallel or at a small angle with respect to the optical axis) and a coma ray COR, which forms an aperture angle α with the chief ray at the intersection point KP. In this case, the coma ray COR represents a ray which passes from a field point of the object field to the opposite edge of the aperture stop relative to the optical axis. The coma ray is an external ray of a beam and together with the profile of the chief ray CR can elucidate the numerical aperture of the projection radiation at the location of the field plane FE1. The greater the aperture angle α, the greater, too, the numerical aperture in the field plane FE1.

The reference sign MS denotes a manipulator surface of a manipulator element of the dedicated telecentricity manipulator. Let the manipulator surface lie initially, in a first operating position of the manipulator, in the field plane FE1, such that the chief ray and the coma ray intersect at the manipulator surface. The refractive indices $n_1$ on the left-hand side (light entrance side) of the manipulator surface and $n_2$ on the right-hand side (light exit side) of the manipulator surface are different. By way of example, gas or vacuum where $n_1 \approx n_1$ may prevail on the light entrance side (left), while the manipulator surface MS is an optical surface of a transparent optical element whose material has a refractive index $n_2 > n_1$. However, $n_2 < n_1$ could also hold true.

If the manipulator surface MS is then displaced by a displacement distance dx parallel to the optical axis or to the chief ray into the position MS' illustrated by a dashed line, then the chief ray CR experiences a phase change or a change in the optical path length in accordance with:

$$OPD_{chief} = dx(n_1 - n_2) = dx \delta n$$

The abbreviation δn stands for the difference in refractive index between $n_1$ and $n_2$. The coma ray COR, by contrast, experiences a different phase change, which can be represented as follows:

$$OPD_{coma} = dy \delta n = dx \frac{\delta n}{\cos(a)}$$

In this case, the parameter α represents the aperture angle of the coma ray COR relative to the chief ray. The optical path length difference $OPD_{chief}$ indicated above corresponds to the global phase of a beam, which can be described with the Zernike coefficient Z1. The difference $$OPD_{chief} - OPD_{coma} = dx \delta n \left(1 - \frac{1}{\cos(a)}\right)$$

between the optical path length difference of the chief ray CR and the optical path length difference of the coma ray COR corresponds to the Zernike coefficients Z2, Z3 and Z4 or the aberrations of distortion (Z2 and Z3) and defocus (Z4) that can be described thereby. All higher Zernike coefficients vanish in this idealized case in which the manipulator surface in one of the operating positions is situated directly in a field plane FE1. These considerations show that in the region of a single field plane the telecentricity cannot be varied or manipulated independently of the distortion (Z2/Z3) and the defocus (Z4). To put it another way, a sought or desired change in the telecentricity also induces undesired (parasitic) aberrations, in particular distortion and defocus.

These considerations also show that a manipulator surface in the region of an intermediate image with a relatively small aperture angle principally influences the telecentricity, the influence on distortion and/or defocus being smaller by comparison therewith.

For the field of projection lenses for microlithography, where the image-side numerical aperture should be relatively high for achieving high resolutions, it can be difficult, with the aid of a single manipulator element in or optically near a field plane, to vary principally the telecentricity to a desired extent, without at the same time likewise noticeably varying defocus and distortion.

By contrast, according to the inventor's insights it is possible to provide a dedicated telecentricity manipulator for a projection lens for microlithography if the projection lens includes two field planes which are accessible for attaching a manipulator element and which are optically conjugate to one another and in which the aperture angles of the coma rays relative to the chief ray (or the numerical apertures) have different magnitudes. Under these preconditions, ideally the manipulator elements can be altered relative to one another such that the sum of the phase changes of the coma rays vanishes, such that all that is left as the remaining induced aberration is the telecentricity or a telecentricity change. The condition for the sum of the phases of the coma rays to vanish can be formulated as follows:

$$OPD_{coma}^{(1)} + OPD_{coma}^{(2)} = dx_1 \frac{\delta n_1}{\cos(a_1)} + dx_2 \frac{\delta n_2}{\cos(a_2)} \stackrel{!}{=} 0$$

or $$dx_2 = -dx_1 \frac{\delta n_1}{\delta n_2} \frac{\cos(a_2)}{\cos(a_1)}$$

In this case, the following relationship results for the variation of the Z1 coefficient or for the variation of the telecentricity that can be described thereby:

$$OPD_{Z1} = OPD_{chief}^{(1)} + OPD_{chief}^{(2)} = dx_1 \delta n_1 \left(1 - \frac{\cos(a_2)}{\cos(a_1)}\right)$$

This shows that it is possible, in principle, with two manipulator elements positioned in different field planes, to realise a pure telecentricity manipulator or a dedicated telecentricity manipulator having an ideal effect. It is immediately evident from the last equation that the effect of the dedicated telecentricity manipulator becomes particularly great if the aperture angles $\alpha_1$ and $\alpha_2$ at the field planes optically conjugate to one another differ greatly.

These insights can be used to configure a dedicated telecentricity manipulator for a projection lens that really exists. This shall be explained on the basis of the example of the projection lens PO from FIG. 4. The object plane OS and the image plane IS therein are field planes optically conjugate to one another. Further field planes optically conjugate thereto are the intermediate image plane of the first intermediate image IMI1 and the intermediate image plane of the second intermediate image IMI2. The total imaging scale (between object plane OS and image plane IS) is 4:1, that is to say a reduction by the factor 4. Accordingly, the numerical aperture in the region of the object plane OS is smaller than the image-side numerical aperture in the region of the image plane IS by a factor of 4.

A dedicated telecentricity manipulator can include a first manipulator element, the manipulator surface of which is as close as possible to the object plane OS, for example in the region of a subaperture ratio SAR of 0.1 or less. A second manipulator element adapted thereto can be arranged in direct optical proximity to the image plane IS, for example in the form of a manipulator surface formed at the entrance side or exit side of the last optical element on the image side (plane plate PP).

A possible practical implementation of the concept in a projection lens PO is described with reference to FIG. 10. The projection lens PO is configured such that a pattern arranged in its object plane OS is imaged into the image plane IS with a reduced imaging scale (e.g. 4:1 or 5:1). This is a three-membered system having three respectively imaging lens parts, wherein a first lens part forms a first intermediate image IMI1, the latter is imaged into a second intermediate image IMI2 via a second imaging lens part, and the second intermediate image is imaged into the image plane with the aid of a third lens part.

The dedicated telecentricity manipulator is embodied in the manner of an Alvarez manipulator including two transparent plate-type manipulator elements ME1, ME2, in the case of which respectively one of the plate surfaces is plane and the other plate surface (first manipulator surface) has an aspherical shape that deviates significantly from a plane surface. The combination of both manipulator elements can be referred to as an Alvarez manipulator. The first manipulator element ME1 is arranged directly downstream of the object plane OS optically near this field plane in such a way that the plane entrance surface and the aspherical exit surface both lie in a region in which the subaperture ratio SAR is less than 0.3 or less than 0.2 or even less than 0.1. The first manipulator element ME1 can be moved in a plane perpendicular to the optical axis OA with the aid of a first actuating device DR1.

The first manipulator element is assigned a second manipulator element ME2, which is part of the Alvarez manipulator and has an asphere similar to that of the first manipulator element ME1.

The second manipulator element ME2 is the last optical element, closest to the image plane IS, of the projection lens and lies in a region in which for both surfaces the subaperture ratio is less than 0.2 or less than 0.1. The second manipulator element ME2 is likewise manipulatable and is actuated upon the displacement of the first manipulator element in such a way that the parasitic effect thereof on distortion and defocus is partly or completely compensated for or minimized, such that substantially only the desired influence on the telecentricity results.

The two manipulator surfaces MS1 and MS2 assigned to one another are designed with regard to their surface shape such that the surfaces each correspond to the form of the antiderivative of a telecentricity error to be corrected. They are shaped complementarily to one another (taking account of the reducing imaging scale). In the first operating position (zero position) illustrated, the first manipulator element ME1 is positioned with respect to the second manipulator element ME2 such that the overall effect of the two manipulator elements on the rays or wavefronts travelling from the object plane to the image plane compensate for one another, such that the two manipulator elements overall do not produce any significant wavefront deformation.

In order to achieve a targeted variation of the telecentricity of the projection lens, the first manipulator element ME1 can be displaced perpendicularly to the optical axis into the dashed second operating position ME1' illustrated, for example, with the aid of the first actuating device DR1. For the chief ray CR discernible in FIG. 10, this has the effect that the chief ray no longer passes through the relatively thicker part of the Alvarez plate ME1, but rather through a part that is thinner relative thereto. In relation to the first manipulator surface MS1, at the location of the chief ray CR this corresponds to a displacement of the manipulator surface from a solid position illustrated into the dashed position, that is to say parallel to the optical axis OA (cf. FIG. 9 and related explanation).

The surface shapes of the manipulator surfaces are then adapted to one another, taking account of the reduced imaging scale applicable between object plane and image plane, such that the effect of the displacement of the first manipulator element ME1 on the distortion (Z2/Z3) and the defocus (Z4) is compensated for to the greatest possible extent by the second manipulator element ME2, while the variation of the telecentricity or of the global phase that is produced as a result of the displacement is substantially not compensated for, such that a variation of the telecentricity in the image plane IS remains as the resulting variation.

Figure 10:
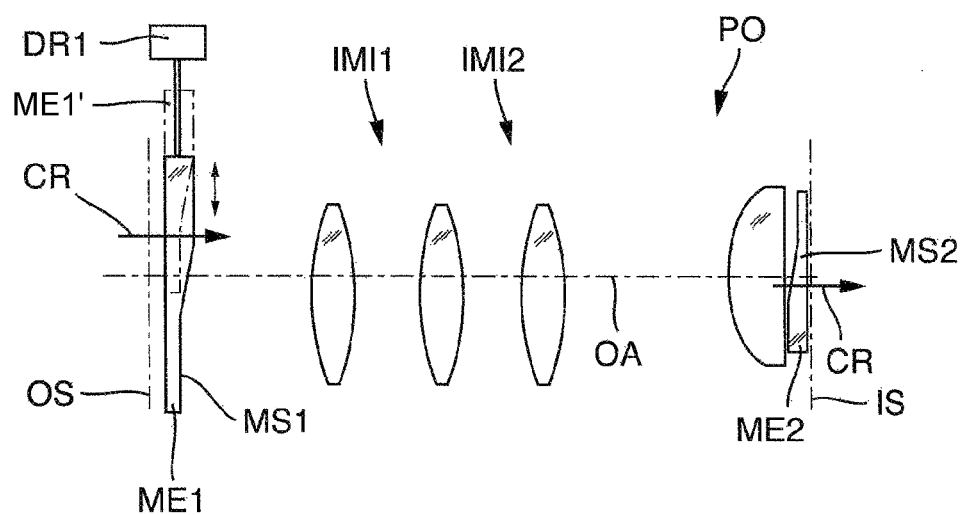
FIG. 10 shows an example of a projection lens including a dedicated telecentricity manipulator in the form of a modified Alvarez manipulator.

In the case of the variant in FIG. 10, therefore, the first field plane (which lies optically near the first manipulator element ME1) is the object plane, while the second field plane, which lies optically near the second manipulator element ME2, is the image plane, wherein the reduced imaging scale between these two planes corresponds to the total imaging scale of the projection lens PO.

Numerous variants are possible. By way of example, the first manipulator element ME2 can alternatively also be positioned in the region of a first intermediate image plane at the first intermediate image IMI1 or in a second intermediate image plane at the second intermediate image IMI2, provided that the third lens part, which images the second intermediate image IMI2 into the image plane IS, has a sufficiently greatly reducing imaging scale. If a reduced imaging is effected overall between the object plane and an intermediate image plane, the second manipulator element could also be arranged in the region of the corresponding intermediate image plane.

Figure 11:
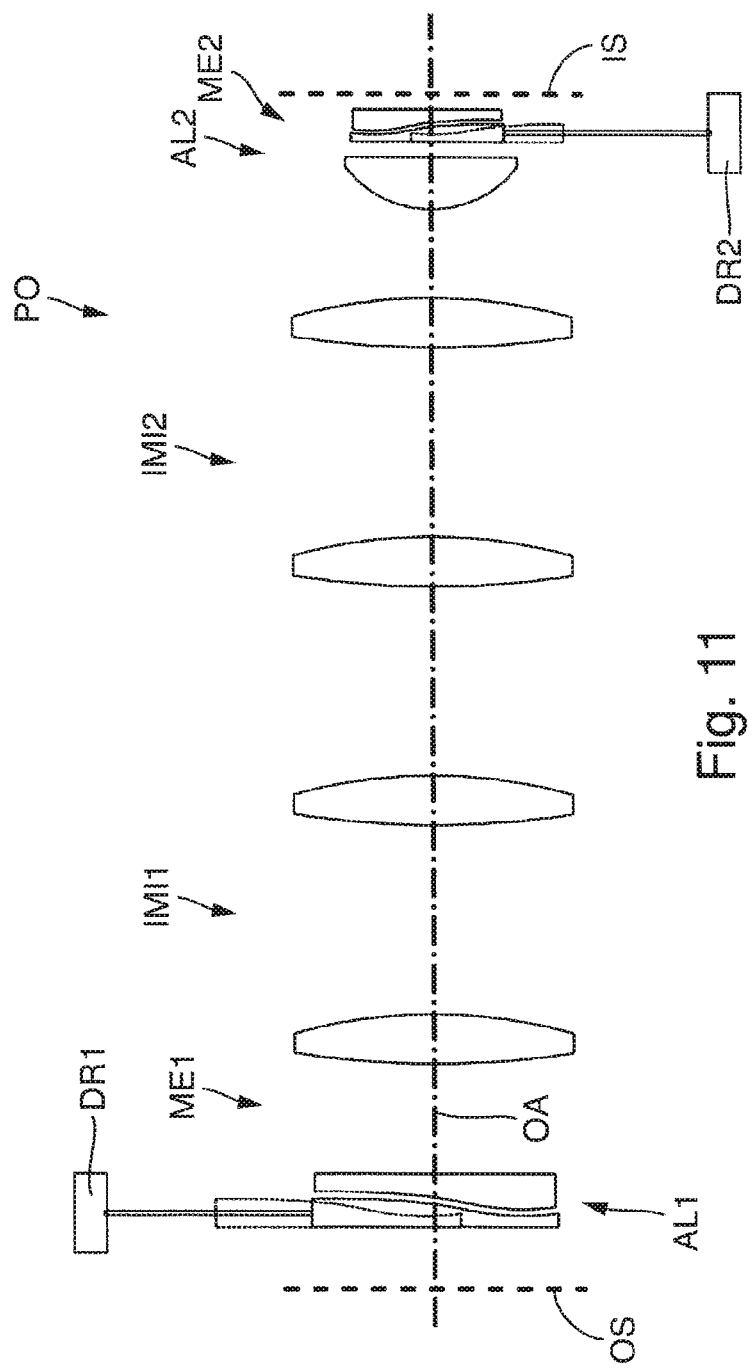
FIG. 11 shows an example of a projection lens including a dedicated telecentricity manipulator including two Alvarez lens elements.

One variant of the embodiment shown in FIG. 10 is shown schematically in FIG. 11. In this variant, a first Alvarez lens element AL1 is situated in optical proximity to the object plane OS and a second Alvarez lens element AL2 is situated in or near a plane conjugate to the object plane, namely the image plane IS. Each of the Alvarez lens elements corresponds to a manipulator element ME1 and ME2, respectively, of the wavefront manipulation system. A size-varying (here a reducing) optical imaging takes place between the Alvarez lens elements. An Alvarez lens element in this sense is an optical element consisting of two plates lying alongside one another (or one behind the other in the beam path) and each having a plane plate surface and an aspherical plate surface. The aspherized plate surfaces facing one another are complementarily aspherized and form the manipulator surfaces. The two manipulator surfaces assigned to one another are designed with regard to their surface shape such that the surfaces each correspond to the form of the antiderivative of a telecentricity error to be corrected. In a zero position, the optical effect of a plane plate results overall for such an Alvarez lens element. Upon relative displacement of the plates (e.g. via the actuating drive DR1 and DR2, respectively) an "air lens" having the desired optical effect arises between the aspherized plate surfaces. Explanations concerning the basic principle are indicated e.g. in the original patent specification U.S. Pat. No. 3,305,294 A.

Suitable manipulator elements are not restricted to transmissive refractive elements or refractive elements through which radiation can be transmitted. It is also possible to design one manipulator element or both manipulator elements of a dedicated telecentricity manipulator as a manipulatable mirror, for example having a deformable mirror surface, which can function as a manipulator surface. A reflective manipulator element having a specularly reflective manipulator surface (for example a bendable mirror) may be expedient for a number of reasons. Firstly, for a mirror or a reflective manipulator surface it holds true that the difference in refractive index is $n_1-n_2=2$, such that in this respect a higher sensitivity is provided and even small deformations can have great effects on the telecentricity. Secondly, in the case of the projection lens in FIG. 4, for example, the intermediate images IMI1, IMI2 or the assigned intermediate image planes are in direct proximity to the mirror surfaces of the folding mirrors FM1, FM2, such that the level of parasitic induced aberrations (which would result from a decentration of a manipulator surface with respect to the nearest field plane) remains very low.

Exemplary embodiments of projection exposure apparatuses in which the insights are implemented via hardware and software are described below.

Figure 12:
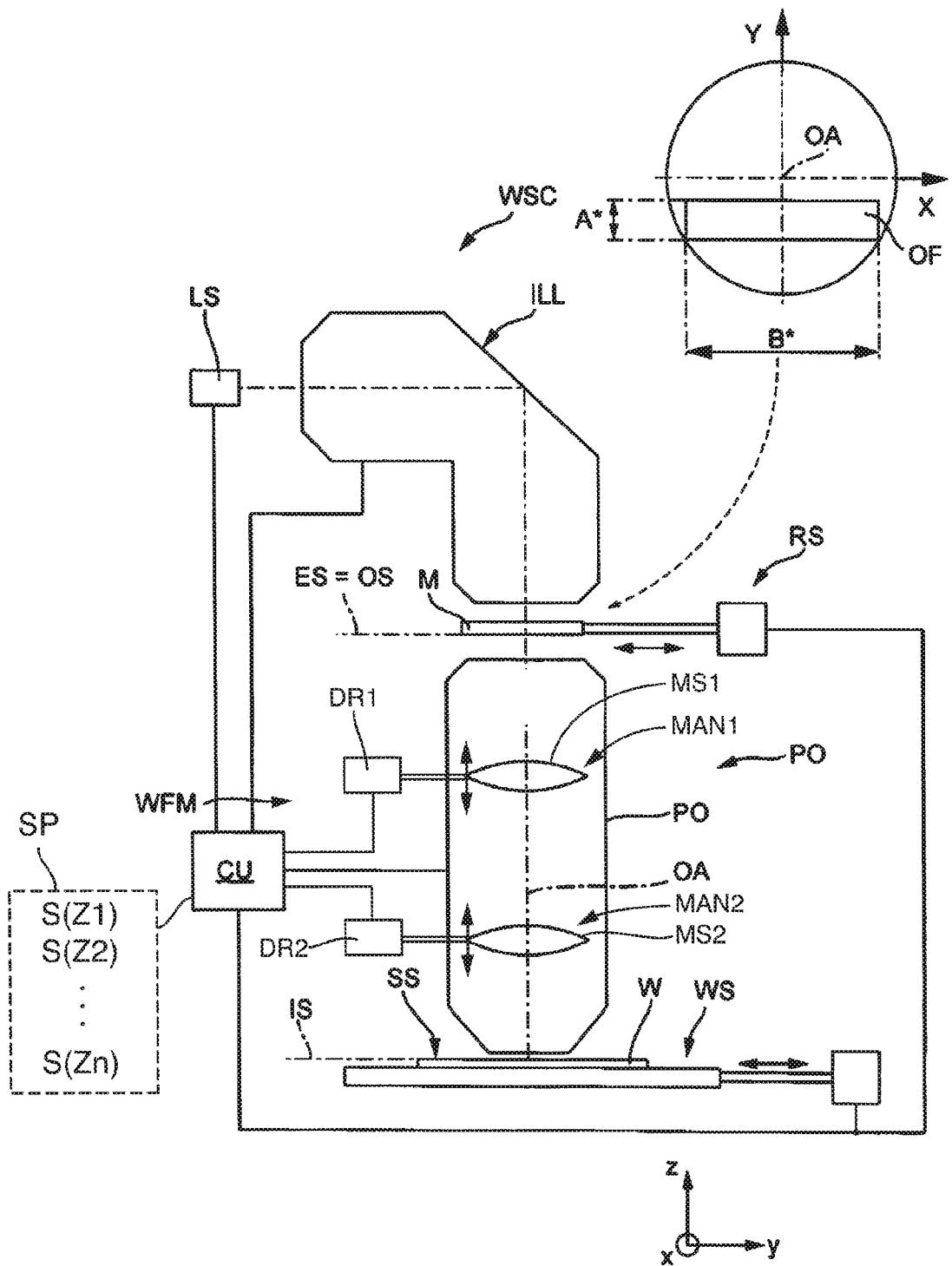
FIG. 12 shows a schematic illustration of a microlithographic projection exposure apparatus in accordance with one exemplary embodiment.

FIG. 12 shows an example of a microlithographic projection exposure apparatus WSC, which is employable in the production of semiconductor components and other finely structured components and which operates with light or electromagnetic radiation from the deep ultraviolet (DUV) range in order to obtain resolutions down to fractions of micrometres. An ArF excimer laser with an operating wavelength λ of approximately 193 nm serves as primary radiation source or light source LS. Other UV laser light sources, for example $F_2$ lasers with an operating wavelength of 157 nm or ArF excimer lasers with an operating wavelength of 248 nm, are also possible.

At its exit surface ES, an illumination system ILL disposed downstream of the light source LS generates a large, sharply delimited and substantially homogeneously illuminated illumination field, which is adapted to the desired properties of telecentricity of the projection lens PO arranged downstream thereof in the light path. The illumination system ILL has devices for setting different illumination modes (illumination settings) and it can be switched for example between conventional on-axis illumination with different degrees of coherence σ and off-axis illumination. By way of example, the off-axis illumination modes include an annular illumination or a dipole illumination or a quadrupole illumination or any other multi-polar illumination. The design of suitable illumination systems is known per se and therefore not explained in any more detail here. The patent application US 2007/0165202 A1 (corresponding to WO 2005/026843 A2) shows examples of illumination systems which can be used within the scope of various embodiments. In this respect, the disclosure content of the patent application is incorporated by reference in the content of this description.

Those optical components which receive the light from the light source LS and shape illumination radiation from this light, which illumination radiation is directed to the illumination field lying in the exit plane ES or to the reticle M, are part of the illumination system ILL of the projection exposure apparatus.

Arranged downstream of the illumination system is a device RS for holding and manipulating the mask M (reticle) in such a way that the pattern PAT arranged at the reticle lies in the region of the object plane OS of the projection lens PO, which coincides with the exit plane ES of the illumination system and which is also referred to here as reticle plane OS. For the purposes of scanner operation, the mask is movable parallel to this plane in a scanning direction (y-direction) perpendicular to the optical axis OA (z-direction) with the aid of a scanning drive.

The device RS includes an integrated lifting device for linearly displacing the mask in relation to the object plane in the z-direction, i.e. perpendicular to the object plane, and an integrated tilting device for tilting the mask about a tilt axis extending in the x-direction.

Following downstream of the reticle plane OS is the projection lens PO, which acts as a reduction lens and images an image of the pattern arranged at the mask M with a reduced scale, for example with the scale of 1:4 ($|\beta|=0.25$) or 1:5 ($|\beta|=0.20$), onto a substrate W coated with a photoresist layer, the light-sensitive substrate surface SS of which lies in the region of the image plane IS of the projection lens PO. The projection lens is nominally doubly telecentric, that is to say has no or only very small deviations from perfect telecentricity on the object side and on the image side.

The substrate to be exposed, which is a semiconductor wafer W in the exemplary case, is held by a device WS which includes a scanner drive in order to move the wafer synchronously with the reticle M perpendicular to the optical axis OA in a scanning direction (y-direction). The device WS furthermore includes a lifting device for linearly displacing the substrate in relation to the image plane in the z-direction and a tilting device for tilting the substrate about a tilt axis extending in the x-direction.

The device WS, which is also referred to as "wafer stage", and the device RS, which is also referred to as "reticle stage", are constituents of a scanner device which is controlled by way of a scan control device which, in the embodiment, is integrated in the central control device CU of the projection exposure apparatus.

The illumination field produced by the illumination system ILL defines the effective object field OF used during the projection exposure. In the exemplary case, the latter is rectangular, it has a height A* measured parallel to the scanning direction (y-direction) and it has a width B*>A* measured perpendicular thereto (in the x-direction). In general, the aspect ratio AR=B*/A* lies between 2 and 10, in particular between 3 and 6. The effective object field lies at a distance next to the optical axis in the y-direction (off-axis field). The effective image field in the image surface IS, which is optically conjugate to the effective object field, likewise is an off-axis field and it has the same shape and the same aspect ratio between the height B and width A as the effective object field, but the absolute field dimension is reduced by the imaging scale β of the projection lens, i.e. A=|β| A* and B=|β|B*.

If the projection lens is designed and operated as an immersion lens, then radiation is transmitted through a thin layer of an immersion liquid during the operation of the projection lens, which thin layer is situated between the exit surface of the projection lens and the image plane IS. Image-side numerical apertures NA>1 are possible during the immersion operation. A configuration as a dry lens is also possible; in this case, the image-side numerical aperture is restricted to values NA<1.

The projection exposure apparatus WSC has an operating control system which is configured to undertake a near-instantaneous fine optimization of imaging-relevant properties of the projection exposure apparatus as a reaction to environmental influences and other disturbances and/or on the basis of stored control data. To this end, the operating control system has a multiplicity of manipulators which permit a targeted intervention into the projection behaviour of the projection exposure apparatus. An actively actuatable manipulator contains one or more actuating members (or one or more actuators), the current manipulated value of which can be modified on the basis of control signals of the operating control system by virtue of defined manipulated value changes being undertaken.

The projection lens or the projection exposure apparatus is equipped with, inter alia, a wavefront manipulation system WFM, which is configured to modify the wavefront of the projection radiation travelling from the object plane OS to the image plane IS in a controllable manner within the meaning of the optical effect of the wavefront manipulation system being able to be variably adjusted by way of control signals of an operating control system.

The wavefront manipulation system in the exemplary embodiment has a multiplicity of mutually independently driveable manipulators MAN1, MAN2 etc., each having at least one manipulator element ME1, ME2 etc., which is arranged in the projection beam path of the projection lens and has a (at least one) manipulator surface MS1, MS2 which is arranged in the projection beam path and whose position (location) and/or orientation and/or surface shape and/or refractive index distribution can be varied reversibly with the aid of an actuating device DR1, DR2 etc. A manipulator can be designed e.g. for a decentration or displacement of an optical element parallel or perpendicular to a reference axis, a tilting of an optical element, a local or global heating or cooling of an optical element and/or a deformation of an optical element. The term "manipulator" also encompasses devices which, on the basis of corresponding control signals of an operating control system, act on the mask or on the substrate in order for example to displace, to tilt and/or to deform the mask or the substrate.

In a memory SP of the operating control system, sensitivities $S(Z1)$, $S(Z2)$, ..., $S(Zn)$ of the manipulators are stored for numerous aberrations, which are symbolized here in each case by the associated Zernike coefficients Z1 (for telecentricity), Z2 (for the tilt of a wavefront in the x-direction) etc. A dedicated set of sensitivities can be stored for each manipulator. What is important is that telecentricity sensitivities $S(Z1)$ of manipulators for varying the telecentricity are also stored here in addition to the sensitivities also stored in some conventional systems. A telecentricity sensitivity quantitatively describes a relationship between a defined manipulated value change at a manipulator and the effect achieved thereby on the telecentricity in the image field. The operation of the projection exposure apparatus can thus also be controlled taking account of the telecentricity sensitivities, e.g. in such a way that manipulated value changes of a manipulator are limited to magnitudes below a manipulated value limit value taking account of the telecentricity sensitivities.

When determining manipulated value changes of the manipulators, the operating control system uses a target function that describes the quality of the exposure process as a weighted sum of a multiplicity of "lithographic aberrations". In this case, the term "lithographic aberration" is intended to encompass all defects relevant to lithography during the imaging. The lithographic aberrations include, inter alia, aberrations such as distortion (non-uniform displacement of image points in the image field), deviations of the lateral image position (uniform displacement of image points in the image field), image rotation, asymmetrical imaging scale, deformations of the focus position (non-uniform image point displacement perpendicular to the image plane), etc., but also variations of the critical dimensions over the image field (CD variations), differences in the critical dimensions in mutually orthogonal directions (HV aberrations), etc. In general, these aberrations are not uniform over the image field, but rather vary within the image field. Distortion and deformations of the focal plane can lead to overlay aberrations (e.g. overlay aberrations between different patterns (mask structures) and focus aberrations. The lithographic aberrations are influenced by various properties of the projection exposure apparatus or of the projection exposure process, including the substrate, the radiation-sensitive layer on the substrate, the projection ray provided by the light source, the mask and the projection system.

In the case of the projection exposure apparatus WSC, the target function to be optimized by the control programme for each of the manipulators includes a telecentricity sensitivity $S(Z1)$ describing a relationship between a defined manipulated value change at the manipulator and an effect achievable thereby on the telecentricity of the projection radiation in the image field. The optimization of the target function generally involves simulating many manipulated value changes of manipulators and calculating the effects thereof on the target function. Since telecentricity sensitivities are also taken into account, the effects of manipulated value changes at manipulators on the telecentricity can be taken into account in the optimization of the target function. What can thereby be achieved, for example, is that an end customer (user of the projection exposure apparatus), without telecentricity measurement, is afforded a possibility of documenting the deviation of the telecentricity from the telecentricity of the delivery state and a subsequent adjustment by manipulators, and of ensuring that the telecentricity remains in the range of a predefined specification. A predefined specification may be such that image-side telecentricity is to be maintained in a range of less than 20 mrad (millirad), with preferred values of image-side telecentricity in the range of less than 10 mrad, the latter limit particularly applicable for DUV systems.

The projection lens can be assigned a dedicated telecentricity manipulator of the type described in this application in order to make targeted interventions in the telecentricity properties of the projection lens. However, this is not mandatory.

In principle, the lithography optical units in the EUV range cannot be doubly telecentric since no transmissive reticles exist in that wavelength range. These optical systems are therefore simply telecentric (at the wafer) in their design. The insights and concepts described here can also be used in projection exposure apparatus for microlithography with EUV radiation.

What is claimed is:
1. A projection lens, comprising:
a multiplicity of reflective optical elements with optical surfaces are arranged in a projection beam path between an object plane and an image plane so that a pattern in the object plane is imageable in the image plane via the reflective optical elements; and
a wavefront manipulation system configured to dynamically influence a wavefront of projection radiation travelling from the object plane to the image plane,
wherein:
the projection lens comprises a dedicated telecentricity manipulator;
the dedicated telecentricity manipulator comprises a first manipulator element and a second manipulator element separate from the first manipulator element;

the first manipulator element is in the projection beam path in or optically near a first field plane;
the second manipulator element is arranged in the projection beam path in or optically near a second field plane optically conjugate to the first field plane;
the projection lens comprises an actuating device assigned to the first and second manipulator elements; and
the actuating device is configured to bring about a relative change of the first and second manipulator elements with respect to one another so that the first manipulator element brings about a change in telecentricity, distortion and defocus and the second manipulator element partly or completely compensates for the change in distortion and defocus caused by the first manipulator element.

2. The projection lens of claim 1, wherein the first manipulator element comprises a deformable mirror surface.

3. The projection lens of claim 2, wherein the second manipulator element comprises a deformable mirror surface.

4. The projection lens of claim 1, wherein the second manipulator element comprises a deformable mirror surface.

5. An apparatus, comprising:
the projection lens of claim 1,
wherein the apparatus is a projection exposure apparatus.

6. The apparatus of claim 5, further comprising an illumination system configured to illuminate an object plan of the projection lens, wherein the projection lens is configured to image an object in the object plane into an image plane of the projection lens.

7. A method of using a projection exposure apparatus comprising an illumination system and a projection lens, the method comprising:
using the illumination system to illuminate a mask comprising a pattern; and
using the projection lens to project at least a portion of the illuminated pattern of the mask onto an object plane,
wherein the projection lens is a projection lens according to claim 1.

8. A projection lens, comprising:
a first objective part configured to image an object plane of the projection lens into a first intermediate image plane of the projection lens;
a second objective part configured to image the first intermediate image plane of the projection lens into a second intermediate image plane of the projection lens; and
a third objective part configured to image the second intermediate image plane of the projection lens into an image plane of the projection lens,
wherein:
the projection lens comprises a dedicated telecentricity manipulator;
the dedicated telecentricity manipulator comprises a first manipulator element and a second manipulator element separate from the first manipulator element;
the first manipulator element is in the projection beam path in or optically near a first field plane;
the second manipulator element is arranged in the projection beam path in or optically near a second field plane optically conjugate to the first field plane;
the projection lens comprises an actuating device assigned to the first and second manipulator elements; and
the actuating device is configured to bring about a relative change of the first and second manipulator elements with respect to one another so that the first manipulator element brings about a change in telecentricity, distortion and defocus and the second manipulator element partly or completely compensates for the change in distortion and defocus caused by the first manipulator element.

9. The projection lens of claim 8, wherein the first objective part comprises a first multiplicity of refractive optical elements, and the third objective part comprises a second multiplicity of refractive optical elements.

10. The projection lens of claim 9, wherein the second objective part comprises at least one mirror.

11. The projection lens of claim 10, wherein the second objective part comprises at least one refractive optical element.

12. The projection lens of claim 8, wherein the first manipulator element comprises a deformable mirror surface.

13. The projection lens of claim 12, wherein the second manipulator element comprises a deformable mirror surface.

14. The projection lens of claim 8, wherein the second manipulator element comprises a deformable mirror surface.

15. The projection lens of claim 8, wherein the projection lens is a DUV projection lens.

16. An apparatus, comprising:
the projection lens of claim 8,
wherein the apparatus is a projection exposure apparatus.

17. The apparatus of claim 16, further comprising an illumination system configured to illuminate an object plan of the projection lens, wherein the projection lens is configured to image an object in the object plane into an image plane of the projection lens.

18. A method of using a projection exposure apparatus comprising an illumination system and a projection lens, the method comprising:
using the illumination system to illuminate a mask comprising a pattern; and
using the projection lens to project at least a portion of the illuminated pattern of the mask onto an object plane,
wherein the projection lens is a projection lens according to claim 8.

19. A projection lens, comprising:
a first objective part configured to image an object plane of the projection lens into a first intermediate image plane of the projection lens;
a second objective part configured to image the first intermediate image plane of the projection lens into a second intermediate image plane of the projection lens; and
a third objective part configured to image the second intermediate image plane of the projection lens into an image plane of the projection lens,
wherein:
the first objective part is dioptric;
the second objective part comprises a reflective optical element;
the third objective part is dioptric;
the projection lens comprises a dedicated telecentricity manipulator;
the dedicated telecentricity manipulator comprises a first manipulator element and a second manipulator element separate from the first manipulator element;
the first manipulator element is in the projection beam path in or optically near a first field plane;
the second manipulator element is arranged in the projection beam path in or optically near a second field plane optically conjugate to the first field plane;

the projection lens comprises an actuating device assigned to the first and second manipulator elements;

the actuating device is configured to bring about a relative change of the first and second manipulator elements with respect to one another so that the first manipulator element brings about a change in telecentricity, distortion and defocus and the second manipulator element partly or completely compensates for the change in distortion and defocus caused by the first manipulator element; and the projection lens is a DUV projection lens.

20. The projection lens of claim 19, wherein the first manipulator element comprises a deformable mirror surface.

21. The projection lens of claim 20, wherein the second manipulator element comprises a deformable mirror surface.

22. The projection lens of claim 19, wherein the second manipulator element comprises a deformable mirror surface.

* * * * *

UNITED STATES PATENT AND TRADEMARK OFFICE
CERTIFICATE OF CORRECTION

PATENT NO. : 11,181,826 B2  
APPLICATION NO. : 16/989356  
DATED : November 23, 2021  
INVENTOR(S) : Wolf Page 1 of 2

It is certified that error appears in the above-identified patent and that said Letters Patent is hereby corrected as shown below:

In the Specification

Column 3, Line 44, delete "(e.g." and insert -- e.g. --;

Column 9, Line 67, delete "$n_o$" and insert -- $n_0$ --;

Column 10, Line 9, delete "$n_o$" and insert -- $n_0$ --;

Column 10, Line 14, delete "$n_o x$" and insert -- $n_0 x$ --;

Column 10, Line 15, delete "$n_o y$" and insert -- $n_0 y$ --;

Column 10, Line 29, delete "scale" and insert -- scale $\beta$ --;

Column 10, Line 47, delete "CODEV®" and insert -- CODE V® --;

Column 10, Line 60, delete "ky," and insert -- ky; --;

Column 10, Line 63, delete "ky," and insert -- ky; --;

Column 11, Line 6, delete "($K_x$=0, $K_y$=0)." and insert -- ($K_X$=0, $K_Y$=0). --;

Column 11, Line 15, delete "$k_y$," and insert -- $k_y$; --;

Column 11, Line 31, delete "$\frac{\partial}{\partial y}$" and insert -- $\frac{\partial}{\partial Y}$ --;

Column 11, Line 64, delete "CODEV®" and insert -- CODE V® --;

Signed and Sealed this  
Twenty-second Day of February, 2022

Drew Hirshfeld  
*Performing the Functions and Duties of the*  
*Under Secretary of Commerce for Intellectual Property and*  
*Director of the United States Patent and Trademark Office*

Column 12, Line 26, delete "$c_2\ k_y$" and insert -- $c_2 k_y$ --;

Column 12, Line 49, delete "#0," and insert -- $\neq 0$, --;

Column 12, Line 49, delete "#0)" and insert -- $\neq 0$) --;

Column 12, Line 59, delete "FIG." and insert -- FIGS. --;

Column 12, Line 66, delete "($k_x=0, k_y=0$)." and insert -- ($k_x=0$, $k_y=0$) --;

Column 15, Line 43, delete "7B)." and insert -- 7). --;

Column 17, Line 26, delete "$n_1 \approx n_1$" and insert -- $n_1 \approx 1$ --;

Column 24, Line 7, delete "(e.g." and insert -- e.g. --;

In the Claims

Column 25, Line 27, Claim 6, delete "plan" and insert -- plane --;

Column 26, Line 28, Claim 17, delete "plan" and insert -- plane --.